US007910035B2

(12) United States Patent
Gibson et al.

(10) Patent No.: US 7,910,035 B2
(45) Date of Patent: Mar. 22, 2011

(54) METHOD AND SYSTEM FOR MANUFACTURING INTEGRATED MOLDED CONCENTRATOR PHOTOVOLTAIC DEVICE

(75) Inventors: Kevin R. Gibson, Redwood City, CA (US); Abhay Maheshwari, Monte Sereno, CA (US)

(73) Assignee: Solaria Corporation, Fremont, CA (US)

(*) Notice: Subject to any disclaimer, the term of this patent is extended or adjusted under 35 U.S.C. 154(b) by 39 days.

(21) Appl. No.: 12/332,340

(22) Filed: Dec. 11, 2008

(65) Prior Publication Data

US 2009/0152745 A1  Jun. 18, 2009

Related U.S. Application Data

(60) Provisional application No. 61/013,251, filed on Dec. 12, 2007.

(51) Int. Cl.
*B29D 11/00* (2006.01)
*B29C 45/14* (2006.01)

(52) U.S. Cl. ............... 264/272.14; 264/1.7; 264/272.15; 264/279; 136/246

(58) Field of Classification Search ............. 264/272.13, 264/272.14, 272.15, 1.7, 279; 136/246
See application file for complete search history.

(56) References Cited

U.S. PATENT DOCUMENTS

| 2,470,618 | A | 5/1949 | Holden |
| 3,330,700 | A | 7/1967 | Sequeira et al. |
| 3,446,676 | A | 5/1969 | Goldsmith et al. |
| 3,575,721 | A | 4/1971 | Mann |
| 3,597,050 | A | 8/1971 | Plumat |
| 3,641,354 | A | 2/1972 | De Ment |
| 3,700,714 | A | 10/1972 | Hamilton et al. |
| 3,819,417 | A | 6/1974 | Haynos |
| 3,849,880 | A | 11/1974 | Haynos |
| 3,874,931 | A | 4/1975 | Haynos |
| 3,951,633 | A | 4/1976 | Danihel |
| 3,993,505 | A | 11/1976 | Pack |
| 3,999,283 | A | 12/1976 | Dean et al. |
| 4,029,519 | A | 6/1977 | Schertz et al. |
| 4,056,405 | A | 11/1977 | Varandi |
| 4,091,798 | A | 5/1978 | Fletcher et al. |

(Continued)

FOREIGN PATENT DOCUMENTS

AU  743826 B2  2/2002

(Continued)

OTHER PUBLICATIONS

Boedeker Plastics, Inc.: Acrylic Polymethyl-MethAcrylate PMMA datasheet, http://www.boedeker.com/acryl.html; May 7, 1999; pp. 1-2.

(Continued)

*Primary Examiner* — Richard Crispino
*Assistant Examiner* — Robert Dye

(57) ABSTRACT

A method for manufacturing an integrated solar cell and concentrator. The method includes providing a first photovoltaic region and a second photovoltaic region disposed within a first mold member. A second mold member is coupled to the first mold member to form a cavity region. The cavity region forms a first concentrator region overlying a vicinity of the first photovoltaic region and a second concentrator region overlying a vicinity of the second photovoltaic region. The method includes transferring a molding compound in a fluidic state into the cavity region to fill the cavity region with the molding compound and initiating a curing process of the molding compound to form a first concentrator element and a second concentrator element overlying the respective photovoltaic regions.

18 Claims, 14 Drawing Sheets

U.S. PATENT DOCUMENTS

| | | | |
|---|---|---|---|
| 4,097,308 A | 6/1978 | Klein et al. | |
| 4,106,952 A | 8/1978 | Kravitz | |
| 4,118,249 A | 10/1978 | Graven et al. | |
| 4,122,833 A | 10/1978 | Lovelace et al. | |
| 4,143,234 A | 3/1979 | Johnson et al. | |
| 4,166,917 A | 9/1979 | Dorfeld et al. | |
| 4,170,507 A | 10/1979 | Keeling et al. | |
| 4,174,978 A | 11/1979 | Lidorenko et al. | |
| 4,193,820 A | 3/1980 | Thomas | |
| 4,203,646 A | 5/1980 | Desso | |
| 4,239,555 A | 12/1980 | Scharlack et al. | |
| 4,257,821 A | 3/1981 | Kelly et al. | |
| 4,291,191 A | 9/1981 | Dahlberg | |
| 4,293,192 A | 10/1981 | Bronstein | |
| 4,295,463 A | 10/1981 | Citron | |
| 4,333,447 A | 6/1982 | Lemrow et al. | |
| 4,355,478 A | 10/1982 | Armstrong | |
| 4,361,136 A | 11/1982 | Huang | |
| 4,362,903 A | 12/1982 | Eichelberger et al. | |
| 4,404,422 A | 9/1983 | Green et al. | |
| 4,440,153 A | 4/1984 | Melchior | |
| 4,449,514 A | 5/1984 | Selcuk | |
| 4,454,371 A | 6/1984 | Folino | |
| 4,457,297 A | 7/1984 | Sobczak et al. | |
| 4,463,749 A | 8/1984 | Sobczak et al. | |
| 4,495,360 A | 1/1985 | Blair | |
| 4,511,618 A | 4/1985 | Duchene et al. | |
| 4,562,637 A | 1/1986 | Kushima et al. | |
| 4,571,812 A | 2/1986 | Gee | |
| 4,589,191 A | 5/1986 | Green et al. | |
| 4,638,110 A | 1/1987 | Erbert | |
| 4,663,562 A | 5/1987 | Miller et al. | |
| 4,668,314 A | 5/1987 | Endoh et al. | |
| 4,680,074 A | 7/1987 | Schmitz et al. | |
| 4,683,154 A | 7/1987 | Benson et al. | |
| 4,691,994 A | 9/1987 | Afian et al. | |
| 4,692,557 A | 9/1987 | Samuelson et al. | |
| 4,697,042 A | 9/1987 | Schilling | |
| 4,711,972 A | 12/1987 | O'Neill | |
| 4,830,038 A | 5/1989 | Anderson et al. | |
| 4,848,319 A | 7/1989 | Appeldorn | |
| 4,863,224 A | 9/1989 | Afian et al. | |
| 4,953,577 A | 9/1990 | Marshall | |
| 4,964,713 A | 10/1990 | Goetzberger | |
| 4,999,059 A | 3/1991 | Bagno | |
| 5,006,179 A | 4/1991 | Gaddy et al. | |
| 5,011,544 A | 4/1991 | Gaddy et al. | |
| 5,043,198 A | 8/1991 | Maruyama et al. | |
| 5,080,725 A | 1/1992 | Green et al. | |
| 5,118,361 A | 6/1992 | Fraas et al. | |
| 5,153,780 A | 10/1992 | Jorgensen et al. | |
| 5,158,618 A | 10/1992 | Rubin et al. | |
| 5,167,724 A * | 12/1992 | Chiang | 136/246 |
| 5,174,275 A | 12/1992 | Holland | |
| 5,180,442 A | 1/1993 | Elias | |
| 5,180,888 A | 1/1993 | Sugiyama et al. | |
| 5,224,978 A | 7/1993 | Hermant et al. | |
| 5,240,510 A | 8/1993 | Goldade et al. | |
| 5,245,985 A | 9/1993 | Holland | |
| 5,261,970 A | 11/1993 | Landis et al. | |
| 5,344,496 A | 9/1994 | Stern et al. | |
| 5,356,488 A | 10/1994 | Hezel | |
| 5,365,920 A | 11/1994 | Lechner | |
| 5,395,070 A | 3/1995 | Wilk | |
| 5,409,549 A | 4/1995 | Mori | |
| 5,436,725 A | 7/1995 | Ledger | |
| 5,449,626 A | 9/1995 | Hezel | |
| 5,460,659 A | 10/1995 | Krut | |
| 5,466,301 A | 11/1995 | Hammerbacher et al. | |
| 5,468,304 A | 11/1995 | Hammerbacher et al. | |
| 5,478,402 A | 12/1995 | Hanoka | |
| 5,498,297 A | 3/1996 | O'Neill et al. | |
| 5,508,205 A | 4/1996 | Dominquez et al. | |
| 5,517,339 A | 5/1996 | Riccobono et al. | |
| 5,529,054 A | 6/1996 | Shoen | |
| 5,542,409 A | 8/1996 | Sampayo | |
| 5,564,411 A | 10/1996 | Gerics | |
| 5,616,186 A | 4/1997 | Fraas et al. | |
| 5,660,644 A | 8/1997 | Clemens | |
| 5,665,607 A | 9/1997 | Kawama et al. | |
| 5,707,459 A | 1/1998 | Itoyama et al. | |
| 5,709,833 A * | 1/1998 | Simone | 264/328.1 |
| 5,735,966 A | 4/1998 | Luch | |
| 5,782,993 A | 7/1998 | Ponewash | |
| 5,787,878 A | 8/1998 | Ratliff, Jr. | |
| 5,790,304 A | 8/1998 | Sanders et al. | |
| 5,840,147 A | 11/1998 | Grimm | |
| 5,846,444 A | 12/1998 | Edwards et al. | |
| 5,851,309 A | 12/1998 | Kousa | |
| 5,865,905 A | 2/1999 | Clemens | |
| 5,877,874 A | 3/1999 | Rosenberg | |
| 5,882,434 A | 3/1999 | Horne | |
| 5,915,170 A | 6/1999 | Raab et al. | |
| 5,919,316 A | 7/1999 | Bogorad et al. | |
| 5,936,777 A | 8/1999 | Dempewolf | |
| 5,959,787 A | 9/1999 | Fairbanks | |
| 5,964,216 A | 10/1999 | Hoffschmidt et al. | |
| 6,008,449 A | 12/1999 | Cole | |
| 6,020,553 A | 2/2000 | Yogev | |
| 6,034,322 A | 3/2000 | Pollard | |
| 6,049,035 A | 4/2000 | Tsuri et al. | |
| 6,057,505 A | 5/2000 | Ortabasi | |
| 6,074,614 A | 6/2000 | Hafeman et al. | |
| 6,084,175 A | 7/2000 | Perry et al. | |
| 6,091,017 A | 7/2000 | Stern | |
| 6,091,020 A | 7/2000 | Fairbanks et al. | |
| 6,092,392 A | 7/2000 | Verlinden et al. | |
| 6,093,757 A | 7/2000 | Pern | |
| 6,107,564 A | 8/2000 | Aguilera et al. | |
| 6,118,067 A | 9/2000 | Lashley et al. | |
| 6,134,784 A | 10/2000 | Carrie et al. | |
| 6,150,602 A | 11/2000 | Campbell | |
| 6,167,724 B1 | 1/2001 | Pozivil | |
| 6,242,685 B1 | 6/2001 | Mizukami et al. | |
| 6,252,155 B1 | 6/2001 | Ortabasi | |
| 6,264,510 B1 | 7/2001 | Onizuka | |
| 6,274,402 B1 | 8/2001 | Verlinden et al. | |
| 6,274,860 B1 | 8/2001 | Rosenberg | |
| 6,293,803 B1 | 9/2001 | Rust et al. | |
| 6,294,723 B2 | 9/2001 | Uematsu et al. | |
| 6,309,901 B1 | 10/2001 | Tahon et al. | |
| 6,313,395 B1 | 11/2001 | Crane et al. | |
| 6,315,575 B1 | 11/2001 | Kajimoto | |
| 6,320,116 B1 | 11/2001 | Hanoka | |
| 6,323,415 B1 | 11/2001 | Uematsu et al. | |
| 6,333,457 B1 | 12/2001 | Mulligan et al. | |
| 6,333,458 B1 | 12/2001 | Forrest et al. | |
| 6,337,283 B1 | 1/2002 | Verlinden et al. | |
| 6,359,209 B1 | 3/2002 | Glenn et al. | |
| 6,365,823 B1 * | 4/2002 | Kondo | 136/246 |
| 6,387,726 B1 | 5/2002 | Verlinden et al. | |
| 6,395,972 B1 | 5/2002 | Tran et al. | |
| 6,423,568 B1 | 7/2002 | Verlinden et al. | |
| 6,429,037 B1 | 8/2002 | Wenham et al. | |
| 6,433,913 B1 | 8/2002 | Bauer et al. | |
| 6,437,236 B2 | 8/2002 | Watanabe et al. | |
| 6,440,769 B2 | 8/2002 | Peumans et al. | |
| 6,441,297 B1 | 8/2002 | Keller | |
| 6,479,744 B1 | 11/2002 | Tsuzuki et al. | |
| 6,528,716 B2 | 3/2003 | Collette et al. | |
| 6,528,718 B2 | 3/2003 | Yoda et al. | |
| 6,609,836 B1 | 8/2003 | Antonelli et al. | |
| 6,612,705 B1 | 9/2003 | Davidson et al. | |
| 6,617,505 B2 | 9/2003 | Shimada | |
| 6,619,282 B1 | 9/2003 | Michael | |
| 6,620,995 B2 | 9/2003 | Vasylyev et al. | |
| 6,639,733 B2 | 10/2003 | Minano et al. | |
| 6,641,868 B2 | 11/2003 | Abe et al. | |
| 6,666,207 B1 | 12/2003 | Arkas et al. | |
| 6,676,263 B2 | 1/2004 | Winston | |
| 6,700,054 B2 | 3/2004 | Cherney et al. | |
| 6,700,055 B2 | 3/2004 | Barone | |
| 6,758,609 B2 | 7/2004 | Fathi et al. | |
| 6,761,598 B2 | 7/2004 | Onizuka et al. | |
| 6,804,062 B2 | 10/2004 | Atwater et al. | |
| 6,809,250 B2 | 10/2004 | Gerson | |
| 6,815,070 B1 | 11/2004 | Burkle et al. | |

| | | | | | | | |
|---|---|---|---|---|---|---|---|
| 6,822,157 | B2 * | 11/2004 | Fujioka ............ 136/251 | DE | 298 23 351 | U1 | 6/1999 |
| 6,825,052 | B2 | 11/2004 | Eldridge et al. | EP | 0029721 | | 6/1981 |
| 6,829,908 | B2 | 12/2004 | Bowden et al. | EP | 461124 | B1 | 5/1995 |
| 6,843,573 | B2 | 1/2005 | Rabinowitz et al. | EP | 784870 | | 4/1996 |
| 6,849,797 | B2 | 2/2005 | Koyanagi et al. | EP | 657948 | A3 | 6/1997 |
| 6,903,261 | B2 | 6/2005 | Habraken et al. | EP | 1 030 376 | A1 | 8/2000 |
| 6,958,868 | B1 | 10/2005 | Pender | EP | 1174342 | A1 | 1/2002 |
| 7,019,207 | B2 | 3/2006 | Harneit et al. | EP | 1261039 | A1 | 11/2002 |
| 7,055,519 | B2 | 6/2006 | Litwin | EP | 1131586 | B1 | 3/2003 |
| 7,071,134 | B2 | 7/2006 | Koyama et al. | EP | 1342259 | A1 | 9/2003 |
| 7,144,598 | B2 | 12/2006 | Moravec et al. | EP | 1112597 | B1 | 3/2004 |
| 7,156,666 | B2 | 1/2007 | Mann | EP | 1 427 025 | A2 | 6/2004 |
| 7,190,110 | B2 | 3/2007 | Tokai et al. | EP | 1461834 | A1 | 9/2004 |
| 7,250,209 | B2 | 7/2007 | Shibahara et al. | EP | 1 630 875 | A2 | 3/2006 |
| 7,282,240 | B1 | 10/2007 | Jackman et al. | EP | 1 732 141 | A1 | 12/2006 |
| 7,309,831 | B2 | 12/2007 | Yamada | GB | 1187969 | | 4/1970 |
| 7,423,083 | B2 | 9/2008 | Kawaguchi et al. | JP | 61-044741 | A | 3/1986 |
| 7,595,543 | B2 | 9/2009 | Weber et al. | JP | 09018031 | | 1/1997 |
| 2002/0007845 | A1 | 1/2002 | Collette et al. | JP | 10104547 | A2 | 4/1998 |
| 2002/0018308 | A1 | 2/2002 | Winston | WO | WO 9118420 | A1 | 11/1991 |
| 2002/0075579 | A1 | 6/2002 | Vasylyev et al. | WO | WO 9406046 | A1 | 3/1994 |
| 2002/0139414 | A1 | 10/2002 | Vasylyev et al. | WO | WO 9506330 | A1 | 3/1995 |
| 2003/0015233 | A1 | 1/2003 | Barone | WO | WO 9533220 | A1 | 12/1995 |
| 2003/0016539 | A1 | 1/2003 | Minano et al. | WO | WO 9623115 | A1 | 8/1996 |
| 2003/0021897 | A1 | 1/2003 | Abe et al. | WO | WO 9624954 | A1 | 8/1996 |
| 2003/0037569 | A1 | 2/2003 | Arbab et al. | WO | WO 9803823 | A1 | 1/1998 |
| 2003/0037814 | A1 | 2/2003 | Gilbert et al. | WO | WO 9832164 | A1 | 7/1998 |
| 2003/0074976 | A1 | 4/2003 | Ahmad | WO | WO 9905462 | A1 | 2/1999 |
| 2003/0081333 | A1 | 5/2003 | Winston | WO | WO 0074147 | A1 | 12/2000 |
| 2003/0095340 | A1 | 5/2003 | Atwater et al. | WO | WO 0079593 | A1 | 12/2000 |
| 2003/0121542 | A1 | 7/2003 | Harneit et al. | WO | WO 0151962 | A2 | 7/2001 |
| 2003/0156337 | A1 | 8/2003 | Davidson et al. | WO | WO 0155650 | C2 | 8/2001 |
| 2003/0201007 | A1 | 10/2003 | Fraas et al. | WO | WO 0190661 | A3 | 11/2001 |
| 2003/0228114 | A1 | 12/2003 | Fathi et al. | WO | WO 0208058 | A1 | 1/2002 |
| 2003/0228417 | A1 | 12/2003 | Nishikawa et al. | WO | WO 0245143 | A1 | 6/2002 |
| 2004/0004216 | A1 | 1/2004 | Eldridge et al. | WO | WO 02075225 | A2 | 9/2002 |
| 2004/0016454 | A1 | 1/2004 | Murphy et al. | WO | WO 02095838 | A1 | 11/2002 |
| 2004/0021964 | A1 | 2/2004 | Rabinowitz et al. | WO | WO 03019083 | A1 | 3/2003 |
| 2004/0084077 | A1 | 5/2004 | Aylaian | WO | WO 03022578 | A1 | 3/2003 |
| 2004/0092668 | A1 | 5/2004 | Kawaguichi et al. | WO | WO 03047004 | A1 | 6/2003 |
| 2004/0097012 | A1 | 5/2004 | Weber et al. | WO | WO 03049201 | A1 | 6/2003 |
| 2004/0108813 | A1 | 6/2004 | Tokai et al. | WO | WO 03107078 | A2 | 12/2003 |
| 2004/0123895 | A1 | 7/2004 | Kardauskas et al. | WO | WO 2004100252 | A1 | 11/2004 |
| 2004/0134531 | A1 | 7/2004 | Habraken et al. | WO | WO 2006/015430 | A1 | 2/2006 |
| 2004/0194820 | A1 | 10/2004 | Barone | WO | WO 2006/089540 | A2 | 8/2006 |
| 2004/0229394 | A1 | 11/2004 | Yamada | WO | WO2006089540 | * | 8/2006 |
| 2004/0243364 | A1 | 12/2004 | Wendelin et al. | WO | WO 2006/123194 | A1 | 11/2006 |
| 2004/0246605 | A1 | 12/2004 | Stiles et al. | WO | WO 2006/128417 | A1 | 12/2006 |
| 2005/0070059 | A1 | 3/2005 | Blakers et al. | WO | WO 2006/133126 | A2 | 12/2006 |
| 2005/0081908 | A1 | 4/2005 | Stewart | WO | WO 2007/036199 | A2 | 4/2007 |
| 2005/0081909 | A1 | 4/2005 | Paull | | | | |
| 2005/0087294 | A1 | 4/2005 | Rabinowitz | | | | |
| 2005/0133082 | A1 | 6/2005 | Konold et al. | | | | |
| 2006/0054211 | A1 | 3/2006 | Meyers et al. | | | | |
| 2006/0099833 | A1 | 5/2006 | Mann | | | | |
| 2006/0105897 | A1 | 5/2006 | Kasuga et al. | | | | |
| 2006/0207646 | A1 | 9/2006 | Terreau et al. | | | | |
| 2006/0235717 | A1 | 10/2006 | Sharma et al. | | | | |
| 2006/0266406 | A1 | 11/2006 | Faust et al. | | | | |
| 2006/0272698 | A1 * | 12/2006 | Durvasula ............ 136/246 | | | | |
| 2006/0283495 | A1 | 12/2006 | Gibson | | | | |
| 2007/0056626 | A1 | 3/2007 | Funcell | | | | |
| 2007/0095386 | A1 | 5/2007 | Gibson | | | | |
| 2007/0153354 | A1 | 7/2007 | Duston et al. | | | | |
| 2007/0251568 | A1 | 11/2007 | Maeda | | | | |
| 2008/0060696 | A1 | 3/2008 | Ho et al. | | | | |
| 2008/0197376 | A1 * | 8/2008 | Bert et al. ............ 257/99 | | | | |
| 2008/0236655 | A1 | 10/2008 | Baldwin et al. | | | | |
| 2008/0236664 | A1 | 10/2008 | Gibson et al. | | | | |
| 2008/0236740 | A1 | 10/2008 | Gibson et al. | | | | |
| 2008/0241479 | A1 | 10/2008 | Nghiem et al. | | | | |
| 2008/0314438 | A1 | 12/2008 | Tran et al. | | | | |

FOREIGN PATENT DOCUMENTS

| | | |
|---|---|---|
| AU | 220348 A5 | 6/2002 |
| AU | 3902270 A4 | 5/2003 |
| AU | 2349175 AA | 6/2003 |
| CA | 2432300 AA | 6/2002 |
| CA | 2467112 AA | 6/2003 |

OTHER PUBLICATIONS

Pern et al, "Photothermal Stability of an E-Beam Pre-Crosslinked EVA Encapsulant and Its Performance Degradation on a-Si Submodules", NREL/CP-520-31026, Oct. 2001, Lakewood, Colorado.

Petrie, "Additives in Radiation (EB/UV) Cured Adhesive Formulations" www.specialchem4adhesives.com, Oct. 14, 2002.

"Photovoltaic/Solar Panel Laminations;" http://www.madico.com/specialty_pv.asp; Jun. 11, 2007; pp. 1-2.

Solar Electricity Beginner Notes, http://www.sunwindsolar.com/a_lessons/solar_beginner_notes.html; Jan. 8, 2004; pp. 1-2.

ACLAR Fluropolymer Film by SPI Supplies, http://web.archive.org/web/20021022180352/http://www.2spi.com/catalog/photo/acalr-film.shtml, 3 pages.

Andreev et al., "Concentrator PV Modules of "All-Glass" Design With Modified Structure;" Paper 3P-C3-72 presented at WCPEC-3, Osaka Japan; May 11-18, 2003; 4 pages.

Breeze, A.J., et al., "Improving power efficiencies in polymer—polymer blend photvoltaics", Solar Energy Materials & Solar Cells, 83, 2004, pp. 263-271.

"3M Glass Bubbles", Product Catalogue for 3M Energy and Advance Materials, Feb. 18, 2009, pp. 1-3.

Emissivity Values for Common Materials, http://www.infrared-thermography.com/ materials-1.htm, retrieved on Apr. 2, 2010, 4 pages.

King et al. "Photovoltaic Module Performance and Durability Following Long-Term Field Exposure", Prog. Photovol: Res. and Appl., vol. 8, No. 2, p. 241-256 (May 23, 2000).

Marayuma, T., et al. "Wedge-shaped light concentrator using total internal reflection", Solar Energy Materials & Solar Cells, 57, (1999), pp. 75-83.

Nitto Denko, Web page: http://www.nitto.com/ product/datasheet/ 037/index.html as updated on Apr. 18, 2005 from Internet Archive, 2 pages.

Wells, G.M., et al. "Effects of mirror surface roughness on exposure field uniformity in synchrontron x-ray lithography", American Vacuum Society, J. Vac. Sci. Technol., 1991, pp. 3227-3231.

International Search Report and Written Opinion for PCT Patent Application No. PCT/US2010/024943, mailed Apr. 22, 2010, 9 pages.

International Search Report and Written Opinion for PCT Patent Application No. PCT/US2008/71127, mailed Oct. 22, 2008, 9 pages.

International Search Report and Written Opinion for PCT Patent Application No. PCT/US2008/059170 mailed Aug. 6, 2008, 8 pages.

International Search Report and Written Opinion for PCT Patent Application No. PCT/US2008/075134 mailed Dec. 5, 2008, 9 pages.

International Search Report and Written Opinion for PCT Patent Application No. PCT/US2008/064132 mailed Aug. 15, 2008, 10 pages.

International Search Report and Written Opinion for PCT Application No. PCT/US2008/59167, mailed Dec. 8, 2008, 11 pages.

International Search Report and Written Opinion for PCT Patent Application No. PCT/US2006/35793, mailed May 10, 2007, 8 pages.

International Search Report and Written Opinion of PCT Patent Application No. PCT/US2006/29164, mailed Jun. 5, 2008, 15 pages.

International Search Report and Written Opinion for PCT Patent Application No. PCT/US2006/21803, dated Aug. 30, 2007, 21 pages.

Office Action for Chinese Patent Application No. 200680026582.4, mailed May 27, 2010, 14 pages.

Office Action for U.S. Appl. No. 11/445,933 dated Apr. 14, 2010, 7 pages.

Office Action for U.S. Appl. No. 11/445,933 dated Oct. 14, 2009, 8 pages.

Office Action for U.S. Appl. No. 11/445,948 dated Apr. 15, 2010, 27 pages.

Office Action for U.S. Appl. No. 11/445,948 dated May 22, 2009, 18 pages.

Office Action for U.S. Appl. No. 11/354,530 dated Jan. 6, 2010, 7 pages.

Office Action for U.S. Appl. No. 11/493,380 dated Jul. 22, 2009, 22 pages.

Office Action for U.S. Appl. No. 11/493,380 dated Feb. 17, 2009, 24 pages.

Office Action for U.S. Appl. No. 11/493,380 dated May 30, 2008, 25 pages.

Office Action for U.S. Appl. No. 12/136,572 dated Feb. 4, 2010, 15 pages.

Office Action for U.S. Appl. No. 12/136,574 dated Jan. 12, 2010, 15 pages.

Office Action for U.S. Appl. No. 12/136,574 dated Jun. 8, 2009, 10 pages.

Office Action for U.S. Appl. No. 12/136,574 dated Dec. 29, 2008, 9 pages.

Office Action for U.S. Appl. No. 12/136,577 dated Jun. 8, 2009, 12 pages.

Office Action for U.S. Appl. No. 12/136,581 dated Feb. 4, 2010, 13 pages.

Office Action for U.S. Appl. No. 11/0402,490 dated Oct. 30, 2009, 12 pages.

Office Action for U.S. Appl. No. 11/0402,490 dated Mar. 3, 2009, 18 pages.

Office Action for U.S. Appl. No. 12/167,198 dated Dec. 19, 2008, 15 pages.

Office Action for U.S. Appl. No. 11/254,114 dated Feb. 2, 2010, 10 pages.

Office Action for U.S. Appl. No. 11/253,182 dated Feb. 5, 2010, 6 pages.

Office Action for U.S. Appl. No. 11/253,182 dated Jan. 8, 2009, 14 pages.

Office Action for U.S. Appl. No. 11/252,425 dated Oct. 16, 2009, 6 pages.

Office Action for U.S. Appl. No. 11/252,425 dated Mar. 19, 2009, 6 pages.

Office Action for U.S. Appl. No. 11/252,425 dated Jul. 9, 2008, 15 pages.

Office Action for U.S. Appl. No. 11/253,418 dated Sep. 11, 2009, 19 pages.

Office Action for U.S. Appl. No. 11/253,202 dated Aug. 31, 2009, 19 pages.

Office Action for U.S. Appl. No. 11/253,202 dated Feb. 19, 2009, 22 pages.

Office Action for U.S. Appl. No. 11/252,399 dated Dec. 4, 2009, 22 pages.

Office Action for U.S. Appl. No. 11/252,399 dated Jun. 2, 2009, 17 pages.

Office Action for U.S. Appl. No. 11/252,399 dated Aug. 20, 2008, 16 pages.

Office Action for U.S. Appl. No. 11/254,041 dated Jan. 26, 2010, 8 pages.

Office Action for U.S. Appl. No. 11/290,313 dated Apr. 15, 2010, 10 pages.

Office Action for U.S. Appl. No. 11/290,313 dated Sep. 21, 2009, 7 pages.

Office Action for U.S. Appl. No. 11/753,546 dated Mar. 31, 2010, 10 pages.

Office Action for U.S. Appl. No. 12/060,801 dated Apr. 13, 2010, 24 pages.

Office Action for U.S. Appl. No. 11/841,899 of Mar. 11, 2008, 18 pages.

* cited by examiner

METHOD AND SYSTEM FOR MANUFACTURING INTEGRATED MOLDED CONCENTRATOR PHOTOVOLTAIC DEVICE

CROSS-REFERENCES TO RELATED APPLICATIONS

This application claims priority to Provisional Application No. 61/013,651, filed Dec. 12, 2007, commonly assigned, and incorporate herein by reference. This application is related to "Method And Resulting Device For Curing A Polymer Material For Solar Module Applications," application Ser. No. 11/753,546, filed May 24, 2007, and is incorporated herein by reference.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention relates generally to solar energy techniques. In particular, the present invention provides a method for fabricating integrated concentrator photovoltaic elements molded together within one or more substrate members and a resulting device fabricated from the integrated concentrator photovoltaic elements. More particularly, the present invention provides a method and system for manufacturing photovoltaic cells with lowered costs and increased efficiencies. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use come from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. In addition, availability of solar panels is also somewhat scarce. That is, solar panels are often difficult to find and purchase from limited sources of photovoltaic silicon bearing materials.

Partly to reduce the material requirement for manufacturing photovoltaic cells and partly to increase the efficiencies of energy conversion, the manufacturing process often require physically assembling light concentrator elements onto photovoltaic silicon bearing wafer materials. Such assembly, however, can be costly and difficult to manufacture, especially on a large scale. Due to sensitive manufacturing tolerances, the efficiencies of such silicon panels can often be less low than desired.

From the above, it can seen that a method and system for improving manufacturing processes associated with making lost cost, efficient solar devices is highly desirable.

BRIEF SUMMARY OF THE INVENTION

The present invention relates generally to solar energy techniques. In particular, the present invention provides a method for fabricating integrated concentrator photovoltaic elements molded together within one or more substrate members and a resulting device fabricated from the integrated concentrator photovoltaic elements. More particularly, the present invention provides a method and system for manufacturing photovoltaic cells with lowered costs and increased efficiencies. Merely by way of example, the invention has been applied to solar panels, commonly termed modules, but it would be recognized that the invention has a much broader range of applicability.

In a specific embodiment, a method of forming an integrated molded concentrator onto one or more photovoltaic regions is provided. According to the embodiment, the method includes providing a photovoltaic region wherein the photovoltaic region includes a backside surface, a thickness of material (including junction regions), and a frontside surface. In a specific embodiment, the thickness of material is provided between the backside surface and the frontside surface. The method includes providing a first mold member and forming a volume (e.g., evacuated space, displaceable fluid) bounded by the frontside surface of the photovoltaic region and the first mold member. The method includes transferring an optical material, which can be in a fluid state, into the volume to substantially fill the volume. Upon substantially filling the volume, the optical material is coupled to the frontside surface of the photovoltaic region. In a specific embodiment, the optical material is cured to cause the formation of a concentrator element coupled to the frontside surface of the photovoltaic region. The photovoltaic region and the optical material may be released to form a sandwiched structure including the photovoltaic region and the optical material and an interface region (also referred to as an encapsulant layer), which can be an optical coupling material.

According to another embodiment, the method may in general include other processes to form an integrated, molded concentrator element into a photovoltaic device. According to a specific embodiment, the method may further comprise providing a second mold member adapted to operatively couple with the first mold member. The coupling between the first and second members forms a volume bounded by the frontside surface of the photovoltaic region, the first mold member, and the second mold member. The order of the steps described above is also only exemplary. That is, certain steps may be combined, separated, or interchanged. For example, according to an embodiment, the photovoltaic region and the optical material may be first released before the optical material is cured. Alternatively, curing can occur before the photovoltaic region coupled to the optical material is released. Of course, there can be other variations, modifications, and alternatives.

According to another embodiment, the method is adapted to form an array of solar cells or modules. For example, the photovoltaic region may only be one of a plurality of photovoltaic regions configured in an array. According to an embodiment, the array is an N by M array, where N is an integer of 1 and greater and M is an integer of two and greater. The method produces an array of photovoltaic cells where each cell includes an integrated concentrator element molded as part of the cell.

According to another embodiment, the method further provides for the forming of an optical coupling material between the optical material and the frontside surface of the photovoltaic region. According to another embodiment, the method also provides for the coupling of at least one electrode member to the backside surface of the photovoltaic member. According to another embodiment, the curing step comprises subjecting the thickness of the optical material from a thermal plastic state to a thermal set state.

According yet another embodiment, a method for manufacturing an integrated solar cell is provided. The method includes providing a photovoltaic member that has a frontside surface and a backside surface separated by a pre-defined thickness. The method also includes providing for a first substrate member where the first substrate member includes a cavity. The method also includes aligning the first substrate member with the photovoltaic member to mechanically engage the first substrate member with the photovoltaic member. The method may further include positioning a second substrate member to align with the first substrate member to form a volume bounded by the frontside surface of the photovoltaic region, a surface region of the second substrate member, and a surface region of the cavity. The method also includes transferring an optical material into the volume to substantially fill the volume. The optical material in the cavity then couples to the frontside surface of the photovoltaic region. The method also includes a step for curing the optical material coupled to the frontside surface of the photovoltaic region. A portion of the cured optical material may cause the formation of a concentrator element that is coupled to the frontside surface of the photovoltaic region. The method also includes the releasing of the photovoltaic member and the optical material.

According to another embodiment, the method may in general include other steps as necessary to form an integrated, molded concentrator element into a photovoltaic device. For example, according to an embodiment, the method may further comprise providing a second mold member adapted to operatively couple with the first mold member. The coupling between the first and second members forms a volume bounded by the frontside surface of the photovoltaic region, the first mold member, and the second mold member. The order of the steps described above is also only exemplary. For example, according to an embodiment, the photovoltaic region and the optical material may be first released before the optical material is cured.

According to another embodiment, the method is adapted to form an array of solar cells or modules. For example, the photovoltaic region may only be one of a plurality of photovoltaic regions configured in an array. According to an embodiment, the array is an N by M array, where N is an integer of 1 and greater and M is an integer of two and greater. The method produces an array of photovoltaic cells where each cell includes an integrated concentrator element molded as part of the cell.

According to another embodiment, the method further provides for the forming of an optical coupling material between the optical material and the frontside surface of the photovoltaic region. According to another embodiment, the method also provides for the coupling of at least one electrode member to the backside surface of the photovoltaic member. According to another embodiment, the curing step comprises subjecting the thickness of the optical material from a thermal plastic state to a thermal set state.

According to another embodiment, the invention provides for a system for manufacturing an integrated solar cell. The system includes a first substrate member including a photovoltaic region and a cavity region where the cavity region includes a backside surface and the photovoltaic region including a backside surface, a thickness of material, and a frontside surface, the thickness of material being provided between the backside surface and the frontside surface of the photovoltaic region.

According to the embodiment, the system also includes a second substrate member, an injection component, a curing component and a release component. In the specific embodiment, the first substrate member is adapted to mechanically engage the thickness of the photovoltaic region to the cavity region. The first substrate member and the second member are adapted to form a volume bounded by the photovoltaic region and the second substrate member. The injection component is adapted to transfer an optical material into the volume to substantially fill the volume with the optical material. The optical material in the volume is coupled to the frontside surface of the photovoltaic region. The curing component is adapted to cure the optical material coupled to the frontside surface of the photovoltaic region. A concentrator element coupled to the frontside surface of the photovoltaic region is formed as a result. The release component is adapted to release the photovoltaic region and the optical material from the first substrate member and the second substrate member.

According to another embodiment, the first substrate member and the second member is also adapted to form an array of trapezoidal volumes bounded by at least the frontside surface of the photovoltaic region and a surface region of the second substrate member. In the embodiment, the injection component is adapted to transfer the optical material into the array of volumes to substantially fill the volumes to couple the optical material in the array of volumes to the frontside surface of the photovoltaic region. According to an embodiment, the array may be an N by M array, where N is an integer of 1 and greater and M is an integer of two and greater.

According to another embodiment, the system is also adapted to provide an optical coupling material between the optical material and the frontside surface of the photovoltaic region. According to yet another embodiment, the system is adapted to couple the backside surface of the photovoltaic region to at least one electrode member. According to another embodiment, the system is adapted to cure the optical material by subjecting the thickness of the optical material from a thermal plastic state to a thermal set state.

In a specific embodiment, a method for manufacturing an integrated solar cell and concentrator is provided. The method includes providing a first photovoltaic region and a second photovoltaic region disposed within a first mold member. The method includes coupling a second mold member to the first mold member to form a cavity region. In a specific embodiment, the cavity region forms a first concentrator region overlaying a vicinity of the first photovoltaic region and a second concentrator region overlaying a vicinity of the second photovoltaic region. A molding compound in a fluidic state is transferred into the cavity region to fill the cavity region with the molding compound. A curing process of the molding compound is initiated to form a first concentrator element and a second concentrator element overlaying the respective photovoltaic regions.

Many benefits are achieved by way of the present invention over conventional techniques. For example, the present technique provides a solution to manufacture solar elements and solar modules that are cost effective and that leverage existing examples. The invention provides, according to an embodiment, a process that relies upon conventional technology such as silicon materials, although other materials can also be used. The method provides a process for making solar elements and modules where the process makes use of conventional process technologies without substantial modifications.

According to an embodiment, the invention provides for an improved solar cell that is less costly and easier to handle than conventional solar cells. An exemplary solar cell includes a plurality of photovoltaic members or regions that are integrated and sealed within one or more substrate structures. In a preferred embodiment, the invention provides a method and a completed solar cell structure using a plurality of photovoltaic strips that are free and clear from a module or panel assembly and that are integrated and molded together with the plurality of photovoltaic strips during an assembly process. Also in a preferred embodiment, one or more of the resulting solar cells are characterized by less silicon per area (e.g., 80% or less, 50% or less) than conventional solar cells.

In preferred embodiments, the present method and cell structures are light weight and amenable to be used in building structures and the like. According to a specific embodiment, the weight is about the same or slightly more than conventional solar cells at a module level. In a preferred embodiment, a solar cell is configured using a molded concentrator element thereon. Depending upon the embodiment, one or more of these benefits may be achieved. These and other benefits will be described in more detail throughout the present specification and more particularly below.

DETAILED DESCRIPTION OF THE INVENTION

The present invention relates generally to solar energy techniques. In particular, the present invention provides a method for fabricating integrated concentrator photovoltaic elements molded together within one or more substrate members and a resulting device fabricated from the integrated concentrator photovoltaic elements. More particularly, the present invention provides a method and system for manufacturing photovoltaic cells with lowered costs and increased efficiencies. Merely by way of example, the invention has been applied to solar panels, commonly termed modules, but it would be recognized that the invention has a much broader range of applicability.

According to an embodiment, the present invention provides a method and system for manufacturing arrays of integrated molded concentrator element photovoltaic cells. An exemplary method and system includes molding and coupling an array of solar concentrators to an array of photovoltaic cells or modules. The descriptions and diagrams provided in this document show the invention through specific embodiments merely by way of examples, and should not be taken unduly to limit the scope of the invention. For example, merely by way of example, the invention has been applied to solar panels, commonly termed modules, but it would be recognized that the invention has a much broader range of applicability. One of ordinary skill in the art would recognize many variations, modifications, and alternatives.

Figure 1:
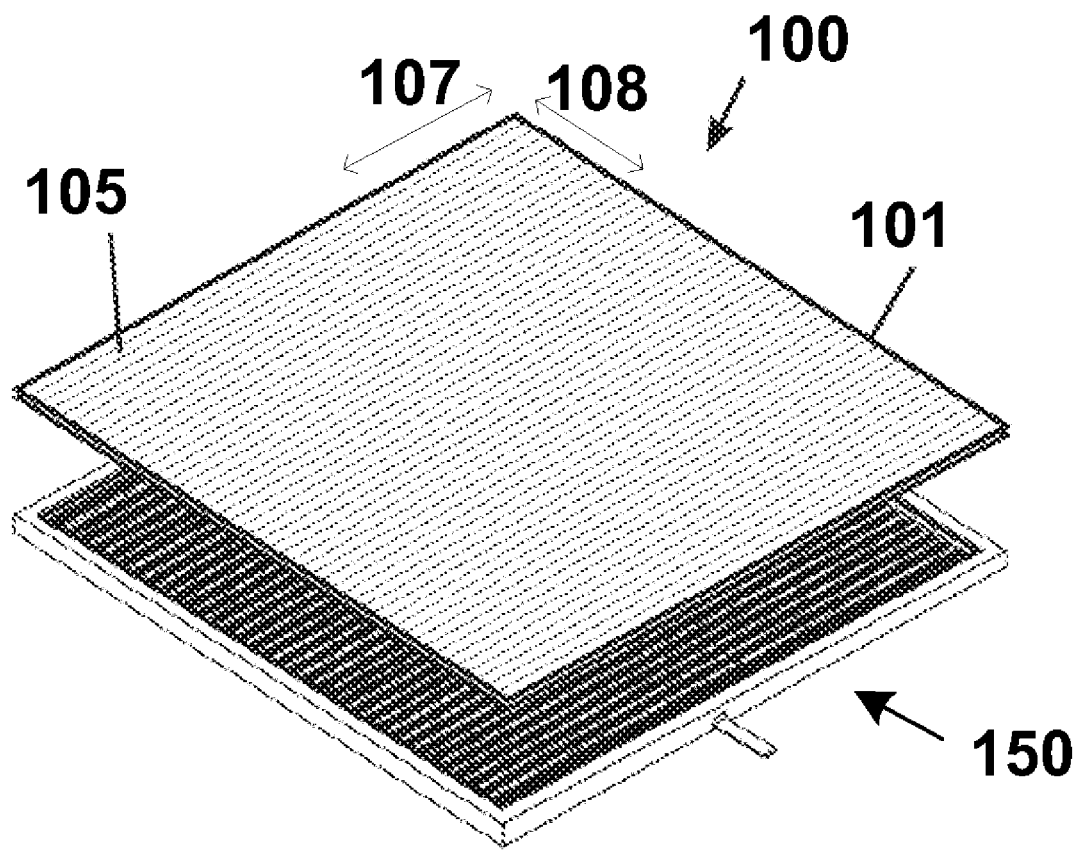
FIG. 1 is a simplified diagram illustrating a front cover including an array of concentrating element overlaying one or more photovoltaic regions according to an embodiment of the present invention.

FIG. 1 shows a simplified diagram illustrating a solar panel 100 according to an embodiment of the present invention. As shown, the solar panel includes a front cover 101 overlaying a plurality of photovoltaic component 150. The photovoltaic component can include a back cover, an array of photovoltaic strips or photovoltaic elements, and an encapsulant. Details on the encapsulant is described throughout the present specification and specifically in FIG. 5. In a preferred embodiment, front cover 101 includes an array of concentrating elements 105 coupled to each of the respective photovoltaic elements. An exemplary array of concentrating elements 105 may be characterized by a first length characterizing a dimensional extent of a unit along a first direction 107 and a second length characterizing the size of the gap separating each unit of concentrating element from each other along a second direction 108.

According to an aspect of the current invention, a portion of front cover 101 includes light concentrators that may be molded onto an array of photovoltaic cells to form an array of integrated concentrator photovoltaic cells. Depending upon the specific embodiments, the front cover member may be created rigid and made of a polymer material, a glass material, a multilayered construction, etc. According to an embodiment, a rigid front cover member can be manufactured by one of a variety of processes including injection, transfer, compression, or extrusion.

According to a specific embodiment, the front cover member is optically transparent and can be characterized by an index of refraction. In a specific embodiment, the front cover member can have an index of refraction of about 1.4 or greater. An exemplary front cover member may be provided by a material with a light transmissivity of 88% or greater. According to another specific embodiment, a front cover member may be provided by a material with a light absorption of 4% or less. Other variations, modifications, and alternatives as contemplated by a person of ordinary skill in the art also exist.

Figure 2:
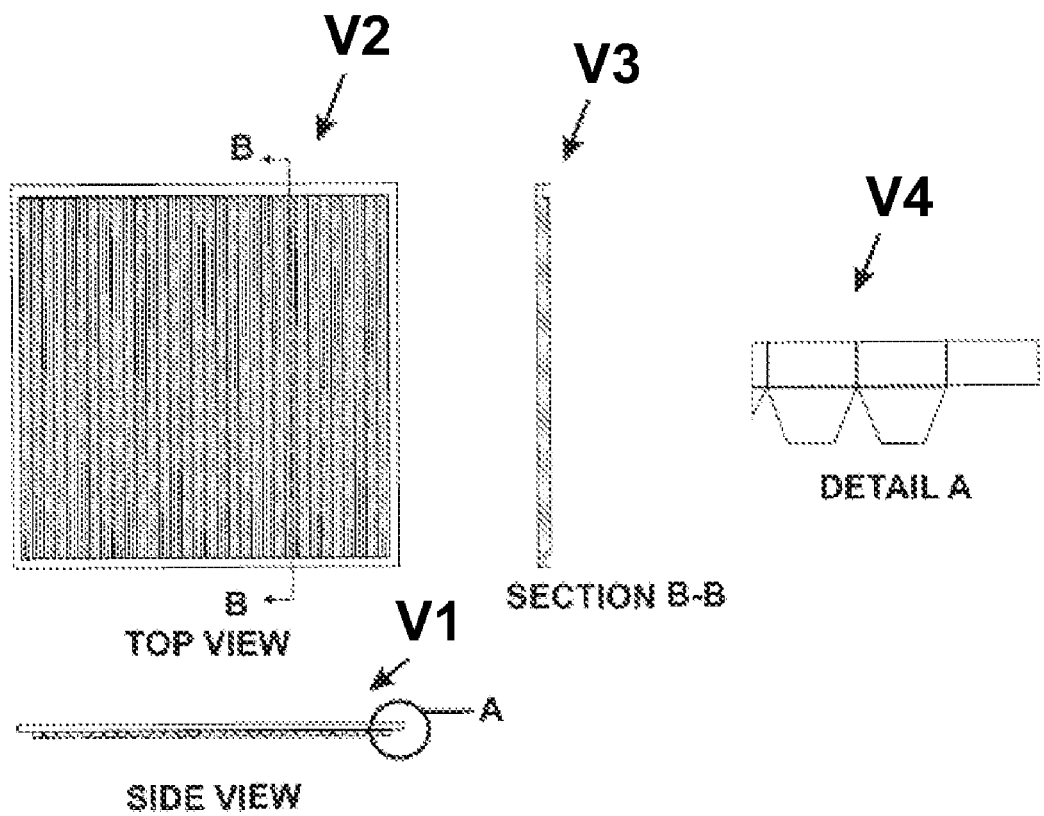
FIG. 2 shows a simplified diagram illustrating a front cover with a plurality of concentrating elements and a side profile of a plurality of concentrating elements according to an embodiment of the present invention.

FIG. 2 shows a simplified diagram illustrating several perspectives of the front cover member and the array of concentrating elements. According to a current embodiment, the front cover is illustrated by a side view V1, a top view V2, and a cross section view V3 across section "B-B," and a close-up profile view V4 including two concentrating elements. Of course there can be other variations, modifications, and alternatives.

Figure 3:
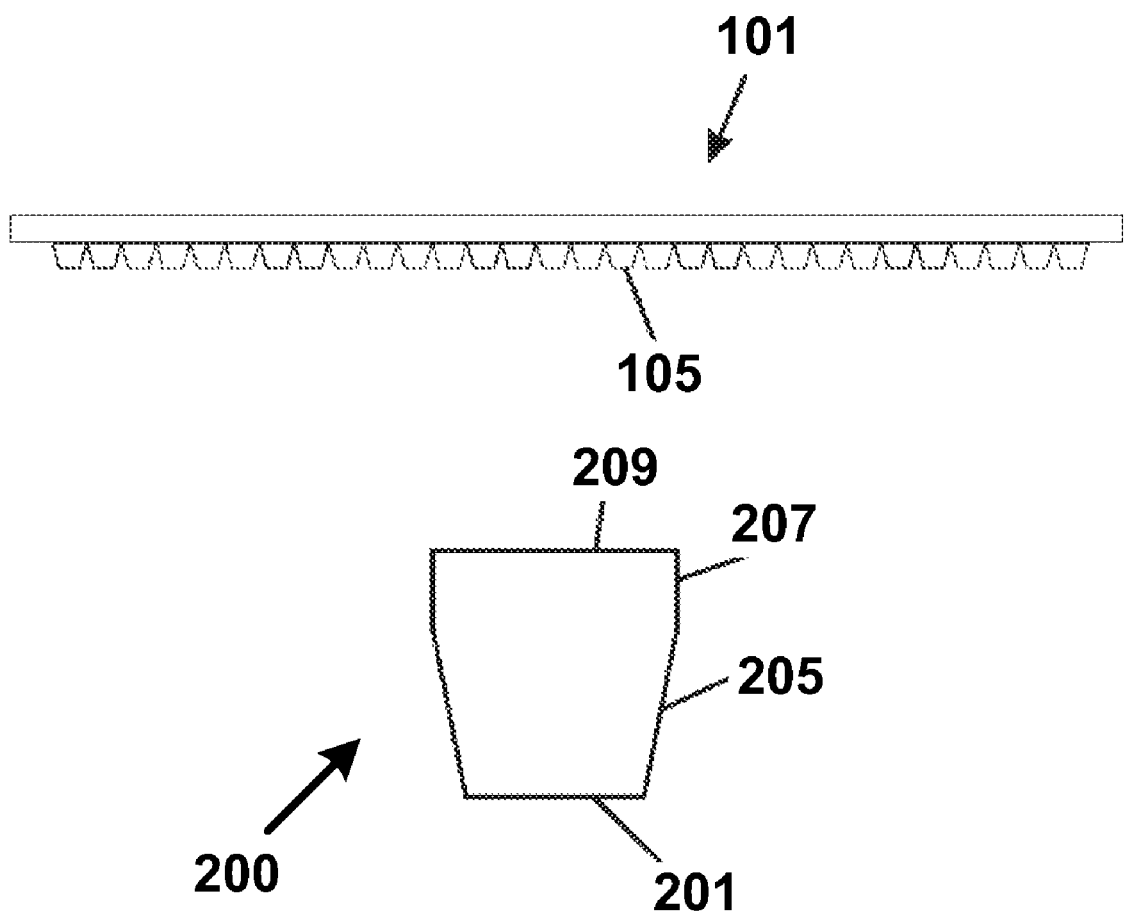
FIG. 3 is a simplified diagram illustrating side profile views of a front cover with an array of concentrating elements according to an embodiment of the present invention.

FIG. 3 shows a simplified diagram illustrating a view of a front cover 101 with a plurality of concentrating elements 105 according to an embodiment of the present invention. This figure also includes a close-up of side profile of a concentrating element 200. As shown, an exemplary concentrating element includes a trapezoidal shaped member, where the trapezoidal shaped member has a bottom surface 201 coupled to a pyramidal shaped region that defined by a lower surface 205 and an upper surface 207. According to the embodiment, the trapezoidal shaped member has an upper surface region 209 which may be co-extensive of front cover 101. In a specific embodiment, each concentrator element 200 may be spatially disposed to be parallel to each other, according to a specific embodiment. An exemplary concentration element 200 also includes a first reflective side 207 and an aperture region 209.

According to an embodiment, a "trapezoidal" or "pyramidal" shaped member includes embodiments with straight, curved, or a combination of straight and curved walls. For example, the trapezoidal or pyramidal surfaces defined by surfaces 205 and 207 may be curved and not necessarily straight as illustrated in FIG. 3. Also, depending upon the specific embodiment, the concentrating elements may be located near the front cover, integrated as part of the front cover, or be coupled to the front cover. According to a preferred embodiment, the front cover and concentrating elements are molded and integrated with photovoltaic members, where the integrated unit is adapted to convert light energy into electrical energy.

Figure 4:
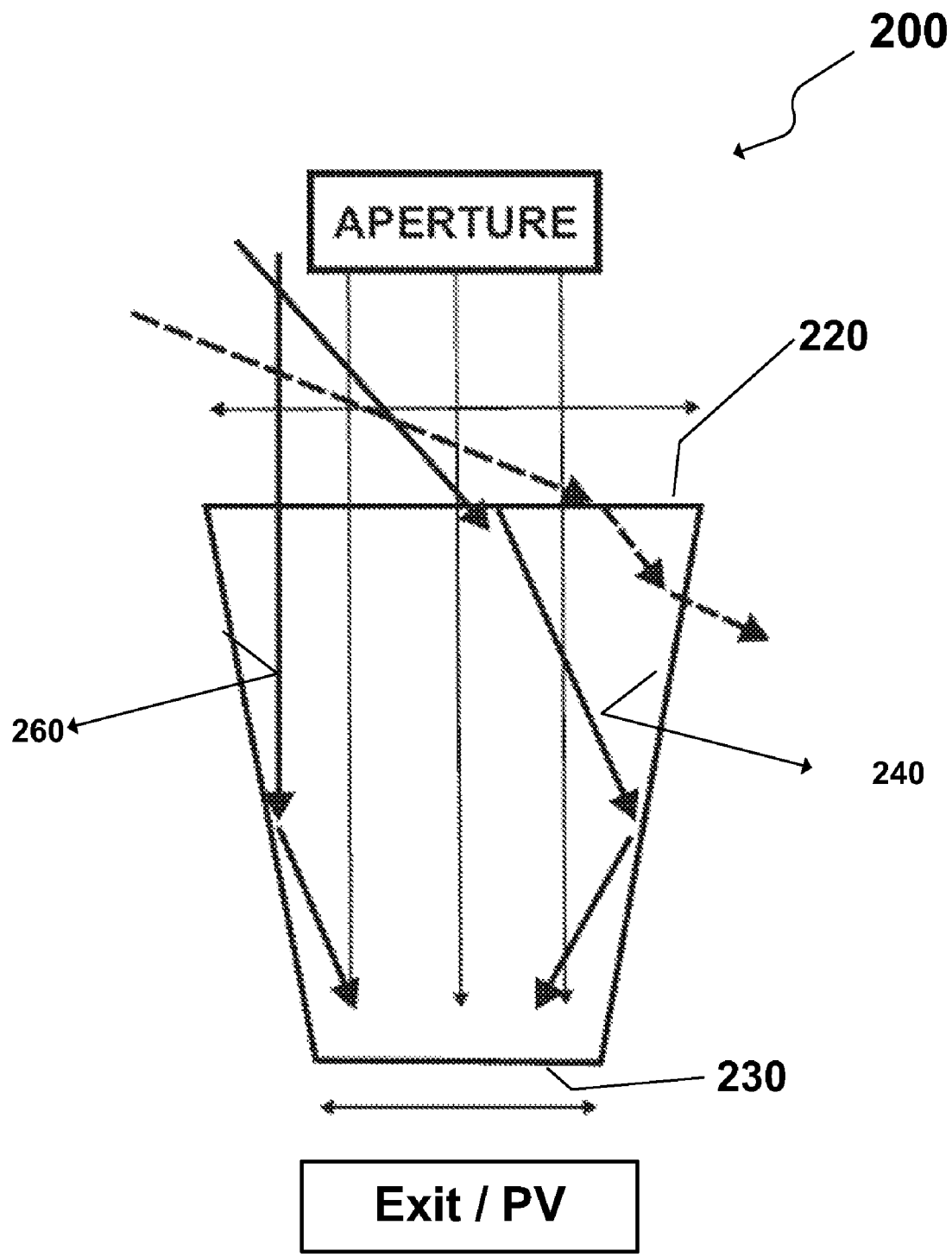
FIG. 4 is a simplified diagram of a few of the details of a concentrator unit according to an embodiment of the present invention.

FIG. 4 shows a simplified diagram of a concentrator element according to an embodiment of the present invention. The concentrator element has an aperture region 220 where light enters the concentrator element and an exit region 230 where light exists. It shows how light rays entering a concentrator may be reflected and directed toward exist region 230. Due to inefficiencies, some of the energy of light entering aperture region 220 may not exit the concentrator through exit region 230. In a specific embodiment, the efficiencies of a concentrator element to direct light from the aperture toward the exist region can be 90% or higher.

According to a specific embodiment, the concentrating element is characterized by a light entrance aperture area 220 and a light exit area 230 where the ratio of light exit area to light entrance aperture area is about 0.8 or less. By way of example, a concentrating element may have light exit area to light entrance aperture area ratio of about 0.5. According to an embodiment, a concentrating element has a height. An exemplary concentrating element has a height of about 7 mm or less. According to another embodiment, the concentrating element may be characterized by a surface roughness that correlates with the reflectivity of the surface. According to a specific embodiment, a first reflective side 240 and a second reflective side 260 of a concentrating element may be characterized by a surface roughness of about 120 nanometers RMS and less. According to another specific embodiment, the surface roughness can have a dimension value of about 10% of a wavelength of a light entering the aperture regions. An exemplary first reflective side and the second reflective side may be adapted to provide for total internal reflection of light entering the aperture region. Of course there can be other variations, modifications, and alternatives.

According to another specific embodiment, an exemplary concentrating element is characterized by reflectivity, durability, and refractivity of one or more coatings on one or more of its surface regions. An exemplary concentrating element includes an anti-reflective coating for improved efficiency. Another exemplary concentrating element includes coatings for improving durability of the concentrating element. Another exemplary concentrating element includes coatings having a refractive index of about 1.45 or greater. Of course, there can be other variations, modifications, and alternatives.

Figure 5:
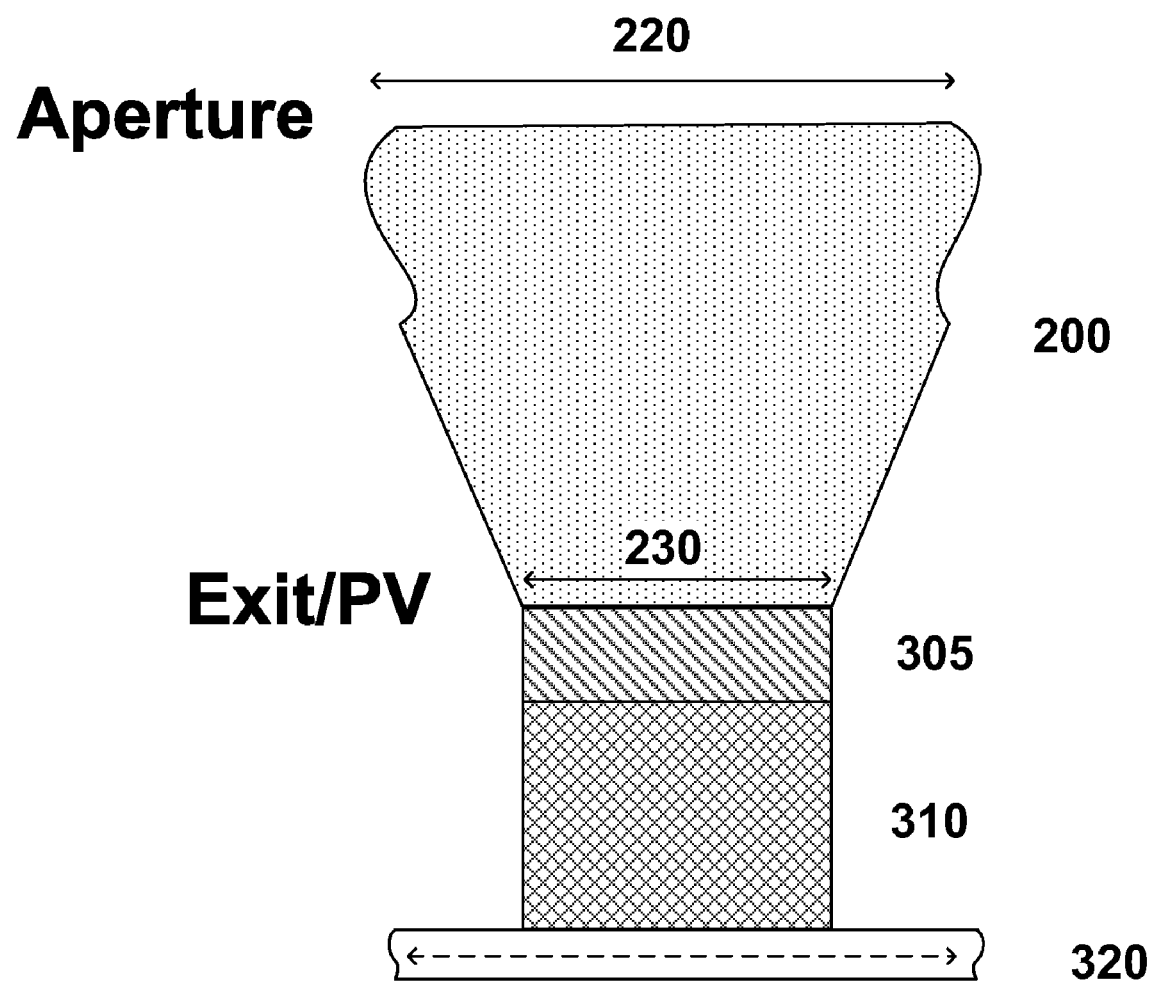
FIG. 5 is a simplified diagram of a basic unit of an integrated concentrator-photovoltaic element according to an embodiment of the present invention.

FIG. 5 shows a simplified diagram of a concentrator unit integrated with a photovoltaic unit according to an embodiment of the present invention. According to an exemplary embodiment, an integrated molded concentrator photovoltaic element includes a molded concentrator 200, an encapsulant 305, an energy conversion element (or photovoltaic element, for example, a photovoltaic strip) 310, and a bus bar 320. In a preferred embodiment, the concentrator 200 is molded directly onto the photovoltaic element. An exemplary integrated concentrator is preferably adapted to efficiently concentrate the light collected at aperture region 220 to exit region 230 coupled to the photovoltaic member, for example a photovoltaic strip in a specific embodiment. The bus bar 320 is provided to conduct electric energy generated to an external load in a preferred embodiment.

According to an embodiment, an encapsulant layer 305 may be provided to compensate for a difference in thermal expansivity between the concentrator material and the photovoltaic material. Encapsulant layer 305 may also provide an improved transmission efficiency of light from the concentrator element 200 to the photovoltaic strip 310. An exemplary concentrator additionally include one or more pocket regions facing a first reflective side or a second reflective side characterized by a refractive index of about 1 in a specific embodiment. According to a specific embodiment, the pocket regions can be configured to allow a total internal reflection of light within a volume of the concentrator element and an efficient transmission of light from the aperture region to the exit region.

Figure 6A:
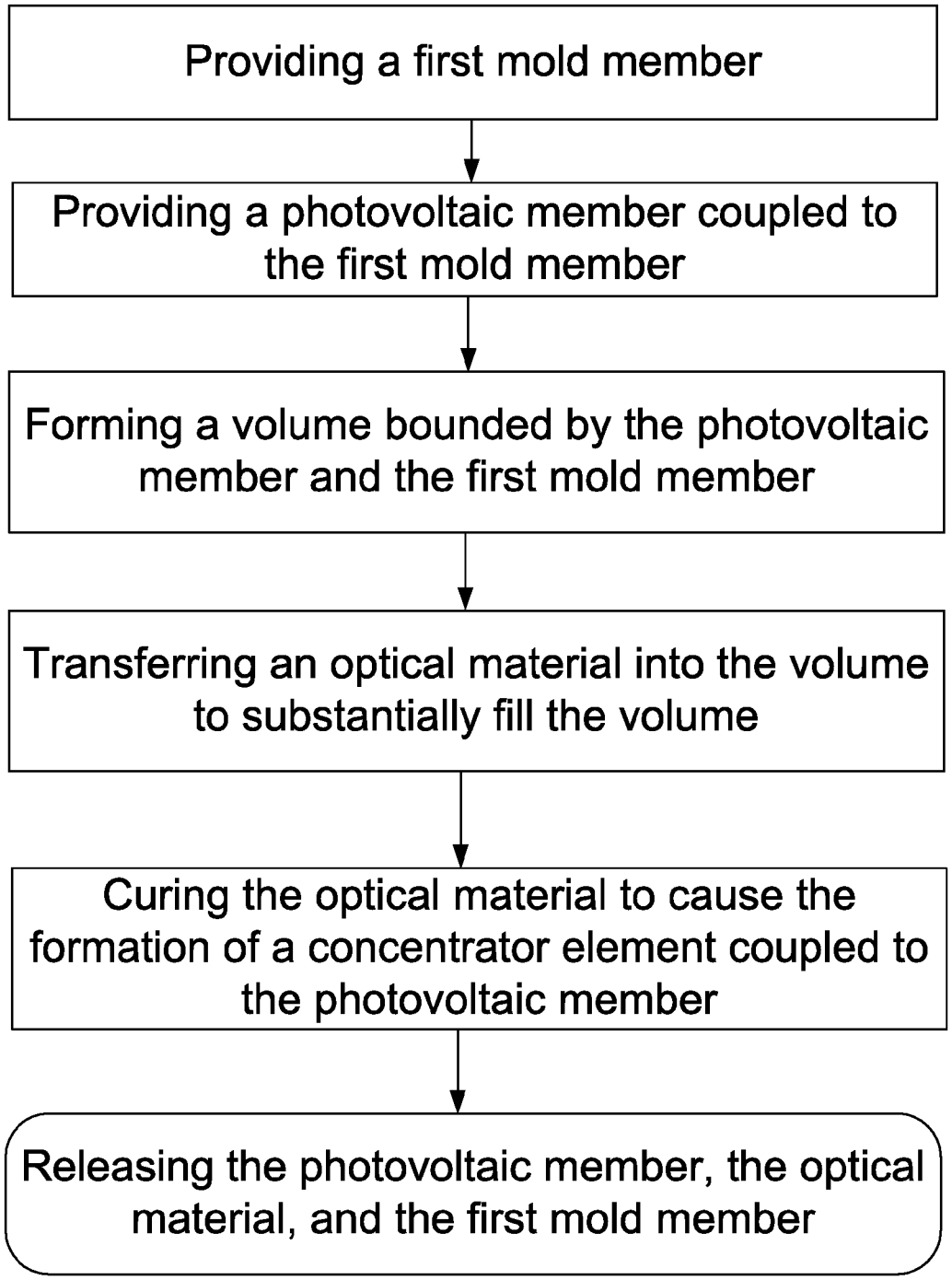
FIGS. 6A-6D is a simplified diagram illustrating a method for manufacturing an integrated concentrator photovoltaic element using one mold member according to an embodiment of the present invention.
Figure 6B:
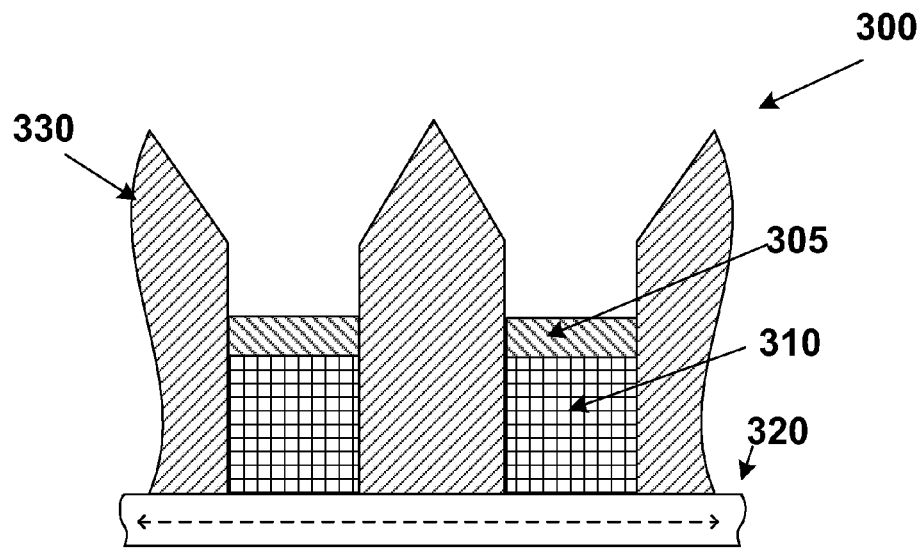
Figure 6C:
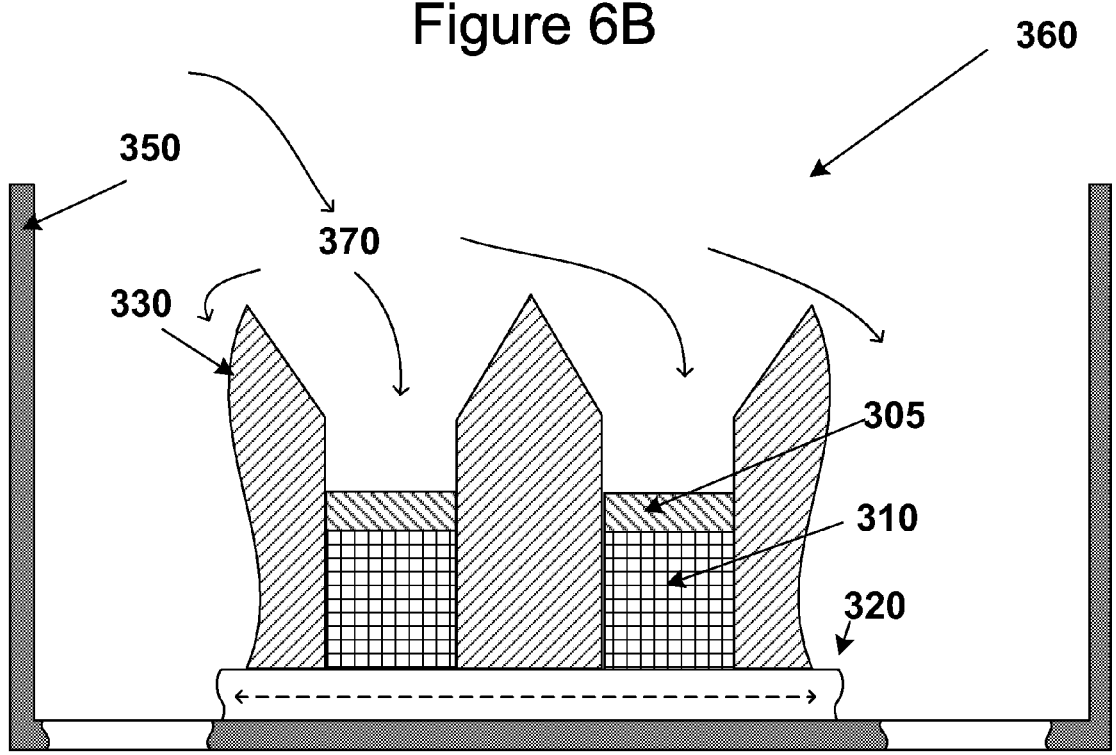
Figure 6D:
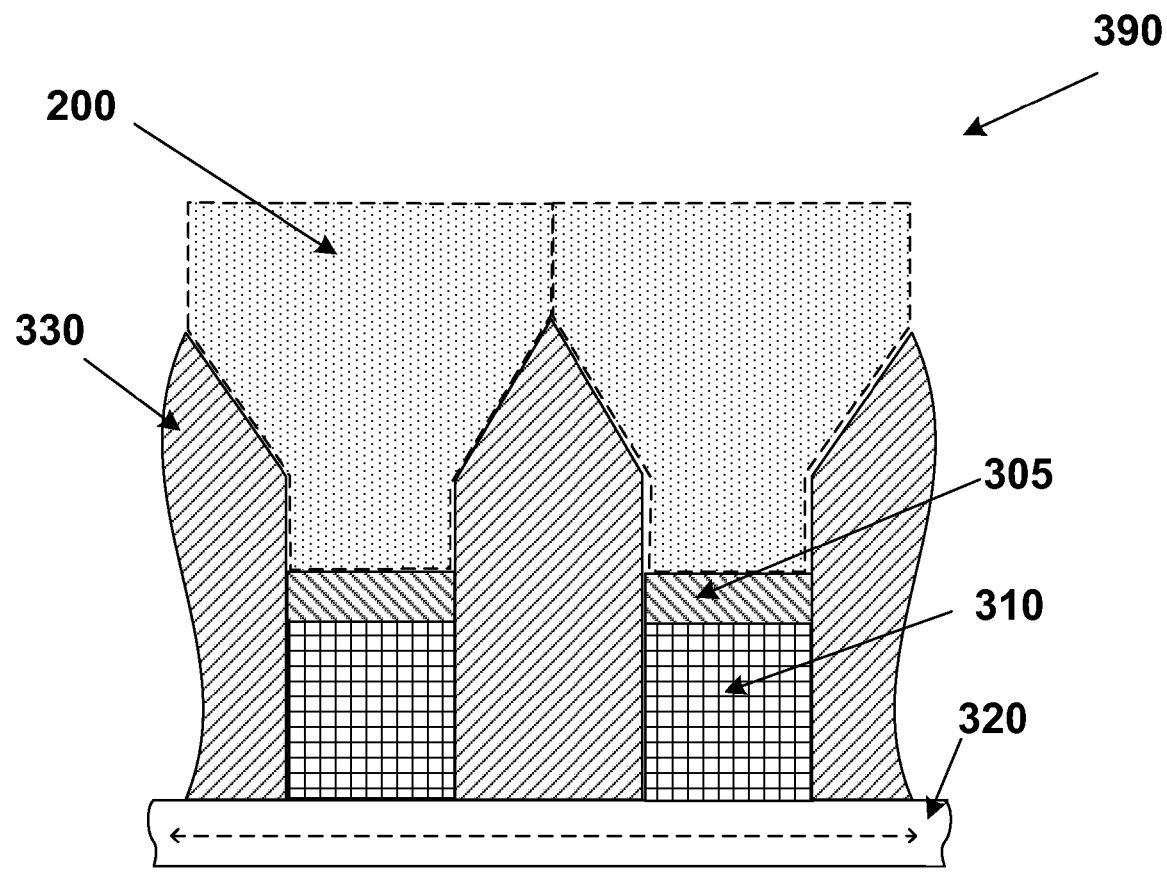

Depending upon the embodiment, the concentrator element may be made of one of several suitable materials. The concentrator element can be made of a polymer, glass, or other optically transparent materials, or a combination of all these materials. A suitable material can be one that is environmentally stable, a material that can preferably withstand environmental temperatures, weather, and other "outdoor" conditions. Of course there can be other variations, modifications, an alternatives FIG. 6A is a simplified diagram illustrating a method for manufacturing an integrated concentrator photovoltaic element using a mold member according to an embodiment of the present invention. FIGS. 6B-6D illustrate the results of an exemplary photovoltaic member being manufactured following the steps of FIG. 6A.

FIG. 6B shows an exemplary photovoltaic member 300 before a concentrator is molded and integrated. According to an embodiment, the photovoltaic member includes an encapsulant layer 305, a photovoltaic strip or element 310 for converting light energy into electrical energy, and a bus bar or conducting element 320 for conducting electrical energy away from the photovoltaic strip or element 310. As shown, each of the photovoltaic member is separated by an isolation material 330. FIG. 6C shows a simplified diagram of the structure of an integrated concentrator as it is being manufactured. FIG. 6D shows a simplified diagram of a product manufactured by the exemplary process.

According to an exemplary embodiment, an exemplary method for manufacturing an integrated concentrator photovoltaic element includes providing a first mold member 350 and photovoltaic member 300 coupled to the first mold member. The method includes coupling photovoltaic member 300 to first mold member 350 and forming a volume 360 bounded in part by photovoltaic member 300 and first mold member 350. The method includes transferring an optical material 370 to volume 360 to substantially fill volume 360.

The method includes a step for curing optical material 370 transferred to the volume to cause the formation of one or more concentrator elements 200 coupled to each of the photovoltaic element 310, as shown in FIG. 6D. An exemplary integrated molded concentrator photovoltaic element 390 produced from the method described above is illustrated. The method includes a step for releasing photovoltaic member 300 and optical material 370 from first mold member 350. Depending on the specific embodiment, the step for releasing may come before, after or during the process of curing the optical material.

Depending on the specific embodiment, the releasing of the photovoltaic member from the first mold member may involve one of several approaches. According to a preferred embodiment, a vacuum can be applied to a top surface of the integrated concentrator photovoltaic device whereby the vacuum is used to pull the concentrator photovoltaic device from the first mold member. In a specific embodiment, the vacuum may be applied using a plurality of suction cups. Preferably, the vacuum is applied uniformly across the entire top surface. Of course there can be other variations, modifications, and alternatives.

FIG. 6D shows two units of an integrated molded concentrator photovoltaic element after the device has been released. An exemplary integrated molded concentrator photovoltaic unit may include a light concentrator component 200, an encapsulant layer 305, a photovoltaic element 310, a conducting element or bus bar 320, and a non-optical component 330 separating the integrated concentrator photovoltaic units from each other.

Figure 7A:
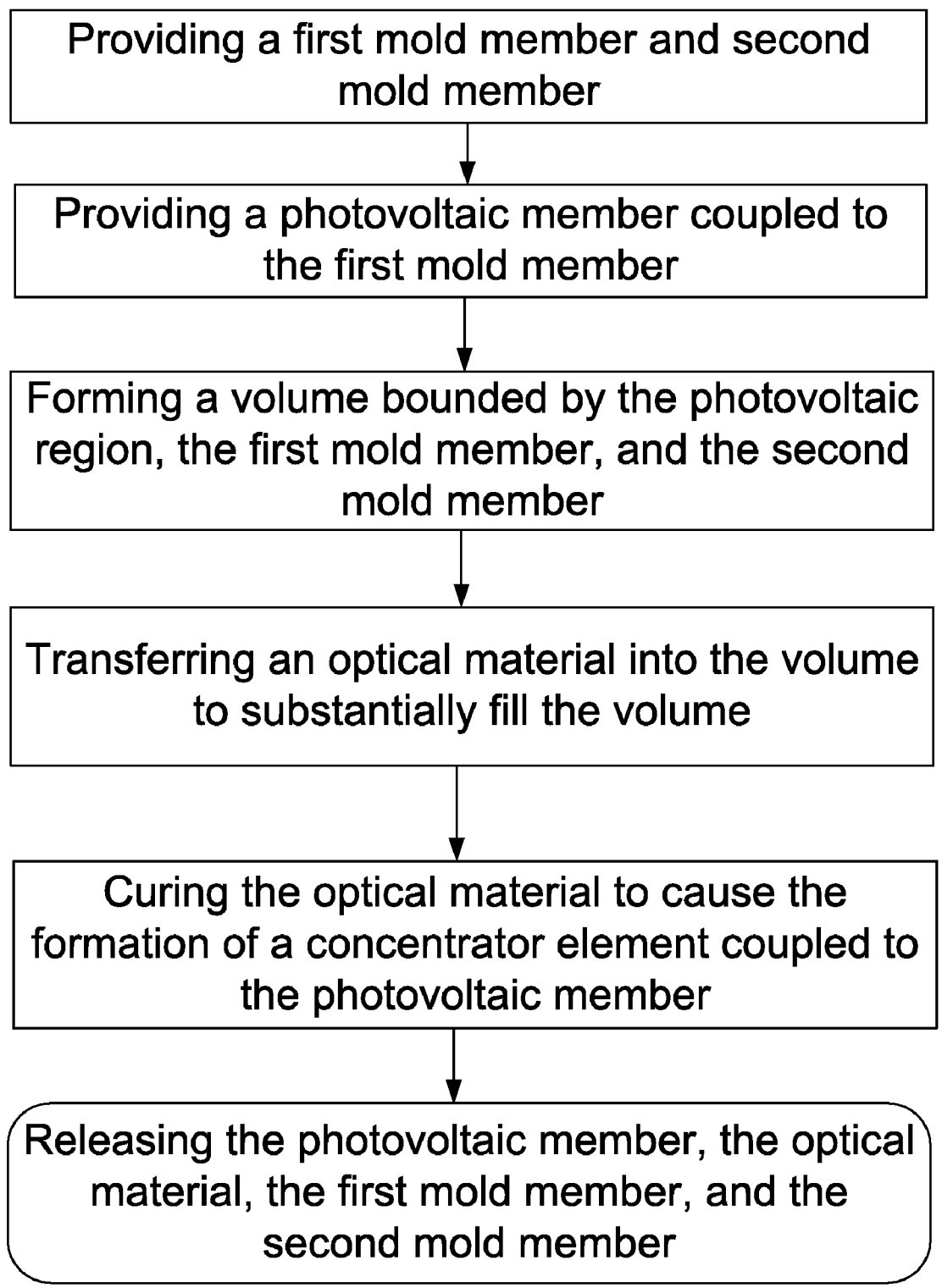
FIGS. 7A-7C is a simplified diagram illustrating a method for manufacturing an integrated concentrator photovoltaic element using two mold members according to an embodiment of the present invention.
Figure 7B:
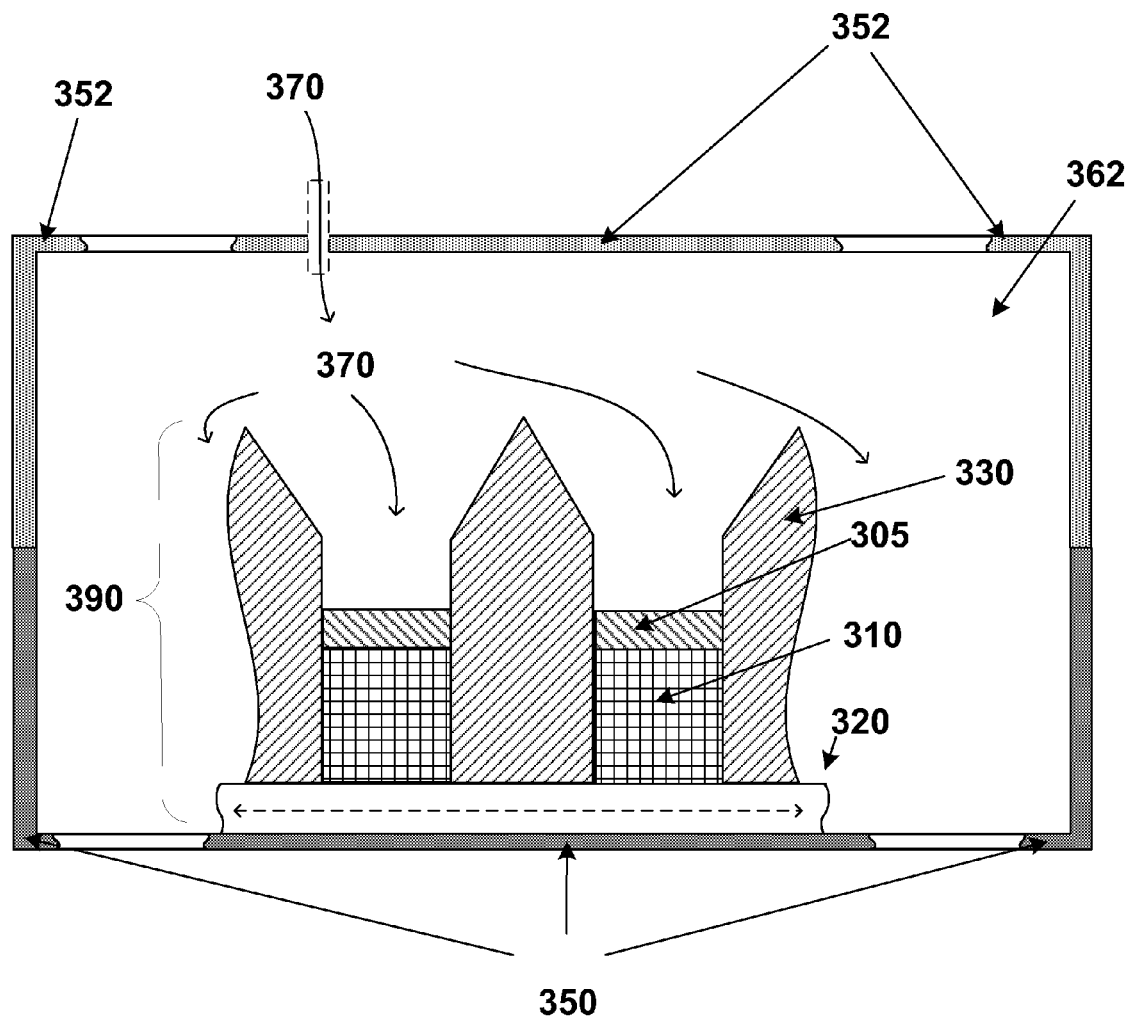

FIG. 7A shows a simplified diagram illustrating a method for manufacturing an integrated concentrator photovoltaic element using two mold members according to an embodiment of the present invention. FIG. 7B shows a simplified diagram of an exemplary molding apparatus that can be used for practicing the exemplary process described in FIG. 7A. FIG. 7B also represents a simplified diagram of an exemplary photovoltaic member undergoing the exemplary process described in FIG. 7A.

According to an embodiment, a method for manufacturing integrated concentrator photovoltaic elements includes providing a first mold member 350 and a second mold member 352. The method includes providing a photovoltaic member 390 coupled to first mold member 350. As shown in FIG. 7B, the method includes forming a volume 362 bounded in part by photovoltaic member 390, first mold member 350, and second mold member 352.

According to the embodiment, the method includes a step for transferring optical material 370 to volume 362 to substantially fill volume 362. The method includes a step for curing optical material 370 transferred to volume 362 to cause the formation of a concentrator element 200 coupled to photovoltaic member 390. The method includes a step for releasing a photovoltaic member 390 including the concentrator element from first mold member 350 and second mold member 352. Depending on the specific embodiment, the step for releasing may come before, after or during the process of curing optical material 370.

Figure 7C:
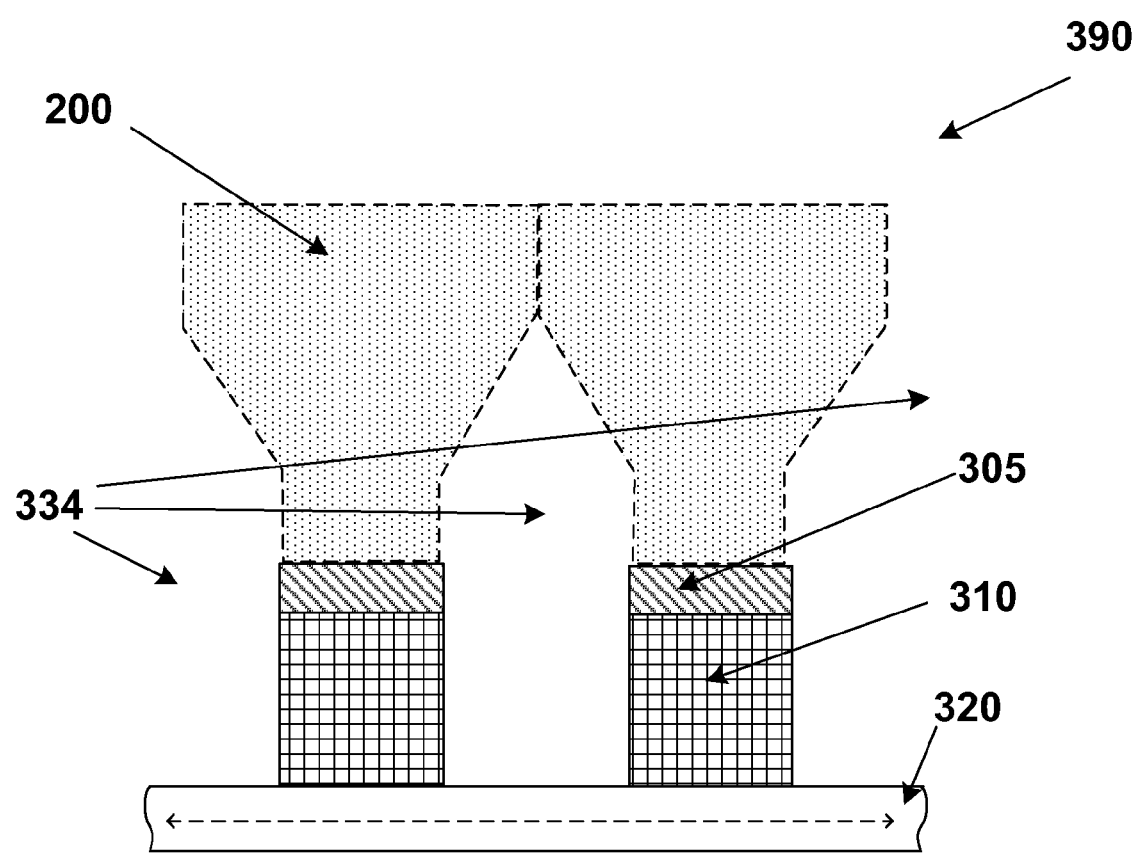

According to a specific embodiment, isolation material 330 is provided to separate units of an integrated molded concentrator photovoltaic element. Isolation material may or may not be released or removed depending on the application. If isolations material 330 is not released or removed, an integrated molded concentrator photovoltaic element similar to the one illustrated in FIG. 6D is produced, according to an embodiment. If isolations material 330 is released or removed, an integrated molded concentrator photovoltaic element similar to the one illustrated in FIG. 7C is produced, according to another embodiment. Of course there can be other variations, modifications, and alternatives.

FIG. 7C shows a simplified diagram illustrating two integrated concentrator photovoltaic units separated by a gap region 334 separating according to an embodiment of the present invention. An exemplary unit of integrated molded concentrator photovoltaic element 390 includes a light concentrator component 200, an encapsulant layer 305, a photovoltaic strip or element 310, a bus bar or energy conducting element 320, and a gap region 334 separating the integrated concentrator photovoltaic units. An exemplary gap region may be created when isolating material 330 is released or removed in a specific embodiment. Of course, there can be other variations, modifications, and alternatives.

Depending on the specific embodiment, the releasing of the photovoltaic member may involve one of several approaches. According to a preferred embodiment, a vacuum may be applied to a top surface of the integrated concentrator photovoltaic device whereby the vacuum is used to pull the concentrator photovoltaic device from the first mold member. In one embodiment, the vacuum may be applied using a plurality of suction cups. In a specific embodiment, the vacuum is applied uniformly across the entire top surface. Of course, there can be other variations, modifications, and alternatives.

Figure 8:
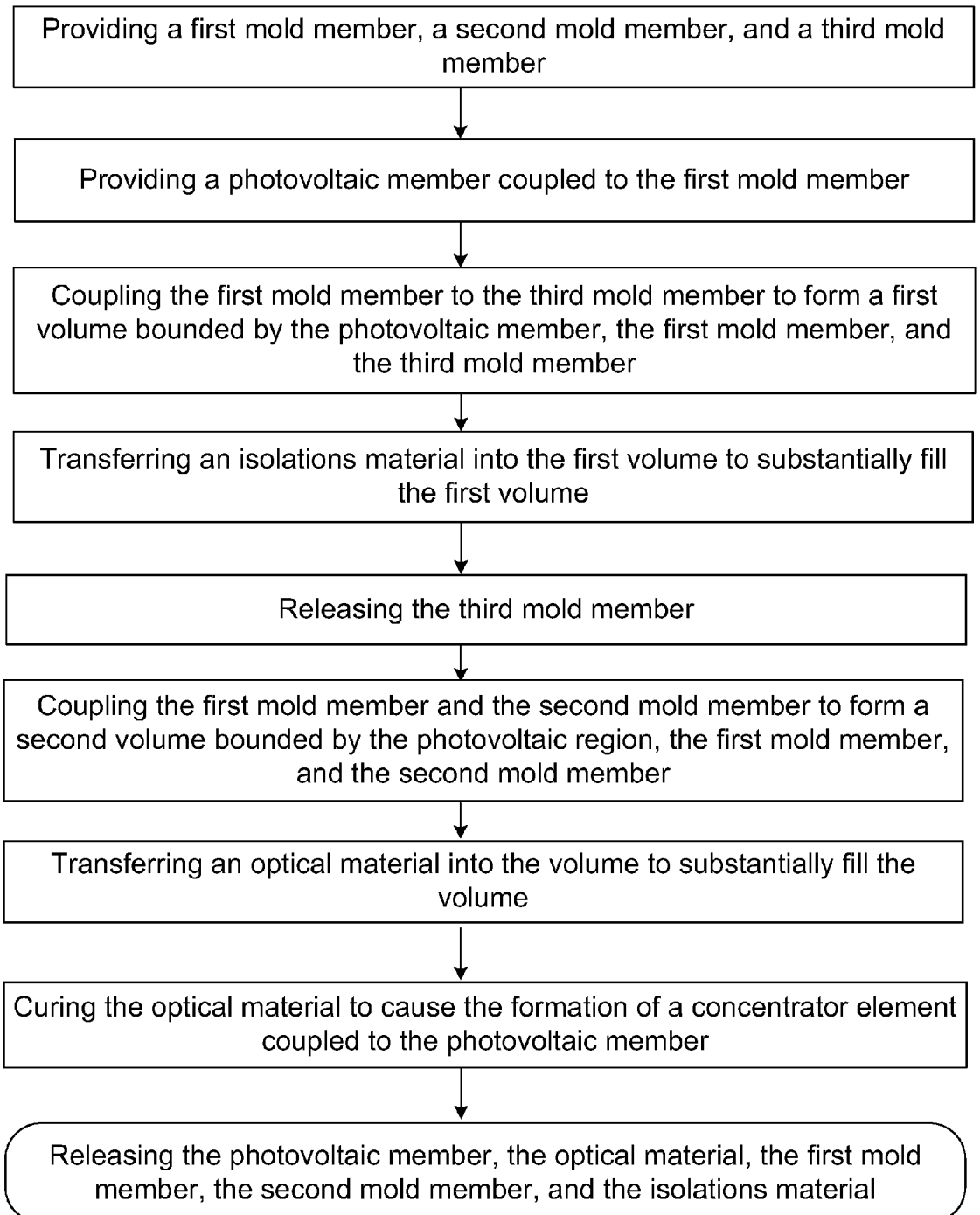
FIG. 8 is a simplified diagram illustrating a method for manufacturing an integrated concentrator photovoltaic element using a two-stage molding process according to an embodiment of the present invention.
Figure 9A:
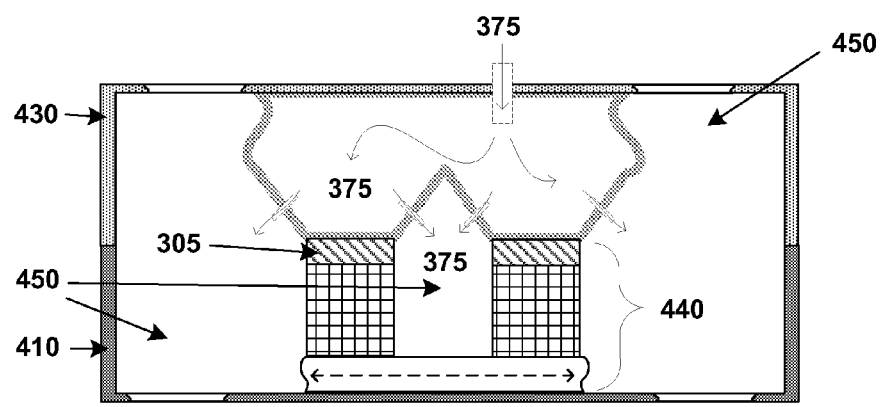
FIGS. 9A-9F present a series of simplified diagrams illustrating various intermediate stages of manufacturing an integrated array of concentrator photovoltaic units using a two stage molding process according to an embodiment of the present invention.
Figure 9B:
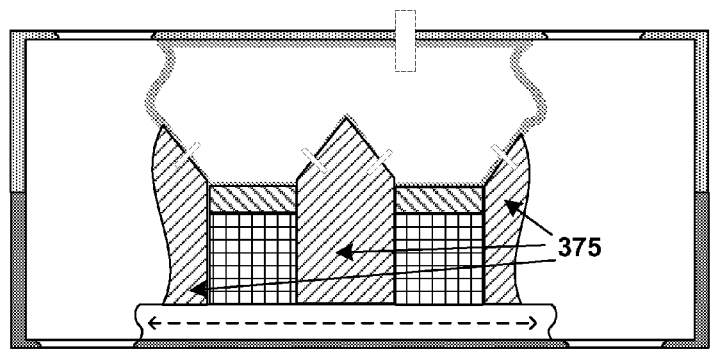
Figure 9C:
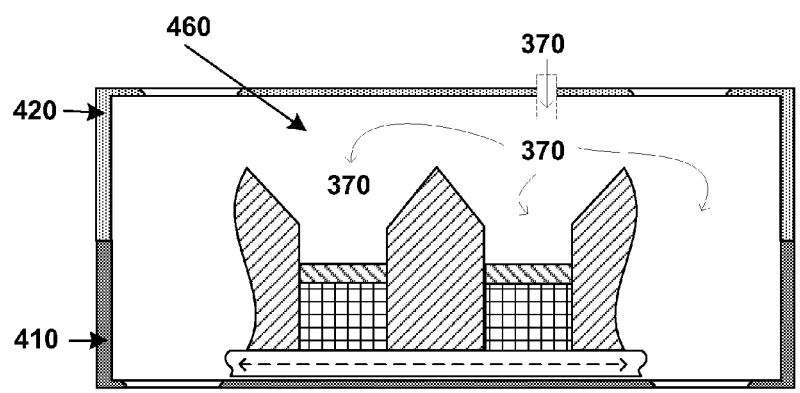
Figure 9D:
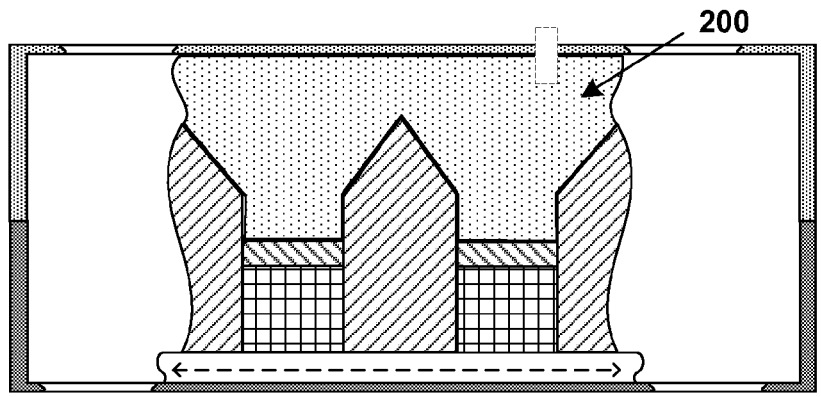
Figure 9E:
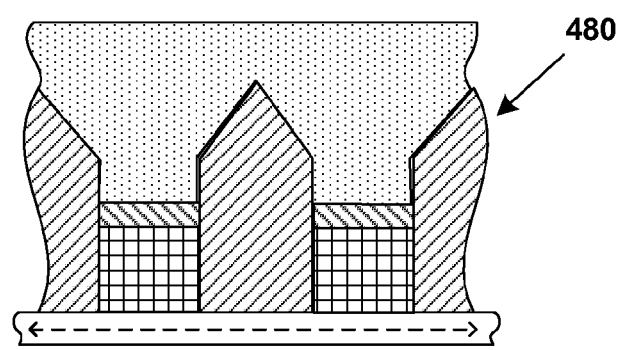
Figure 9F:
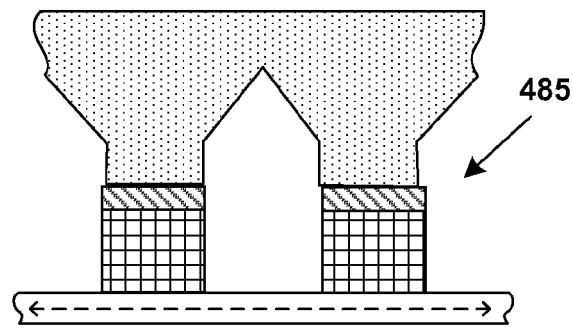

FIG. 8 shows a simplified diagram illustrating a method for manufacturing an integrated concentrator photovoltaic element using a two-stage molding process to create a plurality or array of photovoltaic units according to an embodiment of the present invention. FIGS. 9A-9F show a series of simplified diagrams illustrating the various stages of manufacturing an array of photovoltaic units using an exemplary two-stage molding process.

According to an embodiment, an exemplary method includes providing a first mold member 410, a second mold member 420, and a third mold member 430. The method includes providing a photovoltaic member 440 coupled to first mold member 410. The method includes coupling third mold member 430 with first mold member 410 to form a first volume 450 bounded by photovoltaic member 440, first mold member 410, and third mold member 430. The method includes transferring an isolations material 375 to first volume 450 to substantially fill first volume 450.

The method includes releasing third mold member 430 and coupling second mold member 420 with first mold member 410 to form a second volume 460. The method includes transferring an optical material 370 into the second volume 460 to substantially fill the second volume 460. The method includes curing the optical material 370 to cause the formation of a concentrator element 200 coupled to the photovoltaic member and releasing the integrated concentrator-photovoltaic member 480 from the first mold member 410 and from the second mold member 420.

The order in which the curing and the releasing may differ depending on the specific embodiment. For example, according to one embodiment, releasing and curing steps may occur concurrently. According to another embodiment, the releasing step occurs before the curing process. According to yet another embodiment, the curing process occurs before the releasing step. Whether the isolations material is released or removed also depends on the specific embodiment. For example, according to an embodiment where the isolations material is not released or removed, a device 480 similar to one depicted in FIG. 9E results. According to another embodiment where the isolations material is released or removed from structure 480, an integrated concentrator-photovoltaic device 485 similar to one depicted in FIG. 9F results. Other variations of the processes are possible. For example, instead of providing photovoltaic member 440 for the process, a photovoltaic member 300 (of FIG. 6B) with pre-built isolating units 330 may be provided instead. In that case, a first step to for preparing an isolations layer 375 may not be needed.

Depending on the specific embodiment, the releasing of the photovoltaic member may involve one of several approaches. According to a preferred embodiment, the approach may involve the application of a vacuum to a top surface of the integrated concentrator photovoltaic device whereby the vacuum is used to pull the concentrator photovoltaic device from the manufacturing mold. In one embodiment, the vacuum may be applied through a plurality of suction cups. According to another embodiment, the vacuum may be applied by uniformly across the entire top surface.

The invention disclosed here have been described in terms of specific embodiments and examples. Additional details and variations regarding the method may be provided without deviating from the spirit and scope of the invention. For example, regarding the embodiment shown in FIG. 9A, an exemplary photovoltaic member 440 needs not have an encapsulant layer 305 prefabricated. Encapsulant layer 305 may be introduced onto photovoltaic member 440 as part of the process. For example, before the introduction of an optical material shown in FIG. 9C, an encapsulant material may be introduced to form an encapsulating layer. Alternatively, an encapsulant layer may be introduced and physically bonded to the photovoltaic member before the introduction of the optical material.

Other variations may be made in the methods to manufacture integrated molded concentrator photovoltaic devices without deviating from the spirit and scopes of the embodiments disclosed. According to a specific embodiment, various steps may be added to the method to incorporate additional components to an integrated concentrator photovoltaic device. For example, in the method disclosed in FIG. 6A, FIG. 7A, and FIG. 8, a series of steps may be added to integrate a sheet of specialized optical glass and/or environmental shield after the step to transfer an optical material and before curing the optical material. According to an exemplary embodiment, a sheet of glass such as a Solite Asahi Glass is provided for and bonded to a yet to be uncured optical material before the curing step. An exemplary sheet of Solite Asahi Glass may be between 3.2 and 4 mm. According to the embodiment, when the optical material is cured, the sheet of Solite Asahi Glass become permanently bonded and integrated into the molded concentrator photovoltaic device.

Still other variations exist. As additional examples, the curing process may include any of several types of curing including thermal, chemical, mechanical, and radiation based curing. According to a specific embodiment, the curing processes disclosed in application Ser. No. 11/753,546 filed May 24, 2007 are herein incorporated by reference. It is understood that the examples and embodiments described herein are for illustrative purposes only. Various modifications or changes in light thereof will be suggested to persons skilled in the art. All these are considered to be included within the spirit and purview of this application and scope of the appended claims

What is claimed is:

1. A method for manufacturing an integrated concentrator photovoltaic solar cell, the method comprising:
    providing a first mold member, a second mold member, and a third mold member;
    providing a photovoltaic member coupled to the first mold member;
    coupling the first mold member to the third mold member to form a first volume bounded in part by the photovoltaic member, the first mold member, and the third mold member;
    transferring a first material into the first volume to substantially fill the first volume;
    curing the first material in the first volume to create a zone of isolation separating the photovoltaic member from adjacent photovoltaic members;
    releasing the third mold member;
    coupling the first mold member to the second mold member to form a second volume bounded in part by the photovoltaic member, the first mold member, and the second mold member;
    transferring a second material into the second volume to partially fill the second volume;
    curing the second material in the second volume to form an encapsulant layer coupled to the photovoltaic member;

transferring a third material into the third volume to substantially fill the second volume;
curing the third material in the second volume to form a concentrator element coupled with the encapsulant layer coupled with the photovoltaic member;
releasing the photovoltaic member, the second material, the first mold member, and the second mold member.

2. The method of claim 1 further comprising releasing or removing the first material wherein the zone of isolation separating the photovoltaic member from adjacent photovoltaic members comprises gaps.

3. The method of claim 1 further comprising providing for a sheet of material and bonding the sheet of material to the third material.

4. The method of claim 3 wherein the sheet of material is between 3.2 and 4 mm thick.

5. The method of claim 3 wherein the sheet of material is a glass material.

6. The method of claim 1 wherein the releasing the photovoltaic member includes a use of a vacuum.

7. The method of claim 6 wherein the vacuum is applied on a top surface of the photovoltaic member.

8. A method for manufacturing an integrated solar cell and concentrator, the method comprising:
providing a first photovoltaic region and a second photovoltaic region disposed within a first mold member;
providing a zone of isolation with an isolation material separating the first photovoltaic region from the second photovoltaic region;
coupling a second mold member to the first mold member to form a cavity region, the cavity region forming a first concentrator region overlying a vicinity of the first photovoltaic region and a second concentrator region overlying a vicinity of the second photovoltaic region;
transferring a molding compound in a fluidic state into the cavity region to fill the cavity region with the molding compound; and
initiating a curing process of the molding compound,
wherein the isolation material spatially disposed between the first photovoltaic region and the second photovoltaic region is removed.

9. The method of claim 8 further comprises forming a first concentrator element coupled to the first photovoltaic region and a second concentrator element coupled to the second photovoltaic region from the molding compound after the curing process.

10. The method of claim 8 wherein the molding compound in the fluid state comprises precursors to an optically transparent material.

11. The method of claim 10 wherein the optically transparent material is selected from: ethyl vinyl acetate (EVA), or polyvinyl acetate (PVA).

12. The method of claim 8 further comprises releasing the first photovoltaic region coupled to the first concentrator element and the second photovoltaic region coupled to the second concentrator element from the first molding member.

13. The method of claim 12 wherein the releasing uses a vacuum uniformly applied on a surface region of the integrated solar cell and concentrator.

14. The method of claim 12 wherein the releasing is performed before the curing.

15. The method of claim 12 wherein the releasing is performed after the curing.

16. The method of claim 8 wherein the curing process can be a thermal process, an irradiation process, or a mechanical process.

17. The method of claim 8 further comprises bonding a sheet of glass material to the optically transparent material.

18. The method of claim 8 wherein the first photovoltaic region and the second photovoltaic region are provided in an N by M array, where N is an integer of 1 and greater and M is an integer of two and greater.

* * * * *